(12) United States Patent
Ikeda

(10) Patent No.: US 6,492,220 B2
(45) Date of Patent: *Dec. 10, 2002

(54) METHOD FOR MANUFACTURING SEMICONDUCTOR DEVICE CAPABLE OF SUPPRESSING NARROW CHANNEL WIDTH EFFECT

(75) Inventor: Masahiro Ikeda, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/578,556

(22) Filed: May 25, 2000

(65) Prior Publication Data

US 2002/0081820 A1 Jun. 27, 2002

(30) Foreign Application Priority Data

May 28, 1999 (JP) .......................................... 11-149263

(51) Int. Cl.[7] .............................................. H01L 21/76
(52) U.S. Cl. ........................................ 438/221; 438/433
(58) Field of Search ................................. 438/221, 424, 438/433, 437; 257/508, 510

(56) References Cited

U.S. PATENT DOCUMENTS

| | | | | | |
|---|---|---|---|---|---|
| 4,534,824 A | * | 8/1985 | Chen | ........................... | 438/433 |
| 5,874,346 A | * | 2/1999 | Fulford et al. | ............... | 438/433 |
| 6,030,882 A | * | 2/2000 | Hong | ........................... | 438/433 |
| 6,066,885 A | * | 5/2000 | Fulford et al. | ............... | 438/433 |
| 6,069,057 A | * | 5/2000 | Wu | ............................... | 438/433 |
| 6,143,624 A | * | 11/2000 | Kepler et al. | ................ | 438/433 |
| 6,150,235 A | * | 11/2000 | Doong et al. | ................ | 438/433 |
| 6,150,237 A | * | 11/2000 | Lee | .............................. | 438/433 |

* cited by examiner

Primary Examiner—Olik Chaudhuri
Assistant Examiner—David S Blum
(74) Attorney, Agent, or Firm—Choate, Hall & Stewart

(57) ABSTRACT

In a method for manufacturing a semiconductor device, a shallow trench isolation layer made of silicon oxide is formed in a semiconductor substrate to partition an area for forming a MOS transistor. Then, first impurities are introduced into the MOS transistor forming area to adjust a threshold voltage of the MOS transistor. Then, second impurities are introduced into end portions of the MOS transistor forming area of the semiconductor substrate.

42 Claims, 35 Drawing Sheets

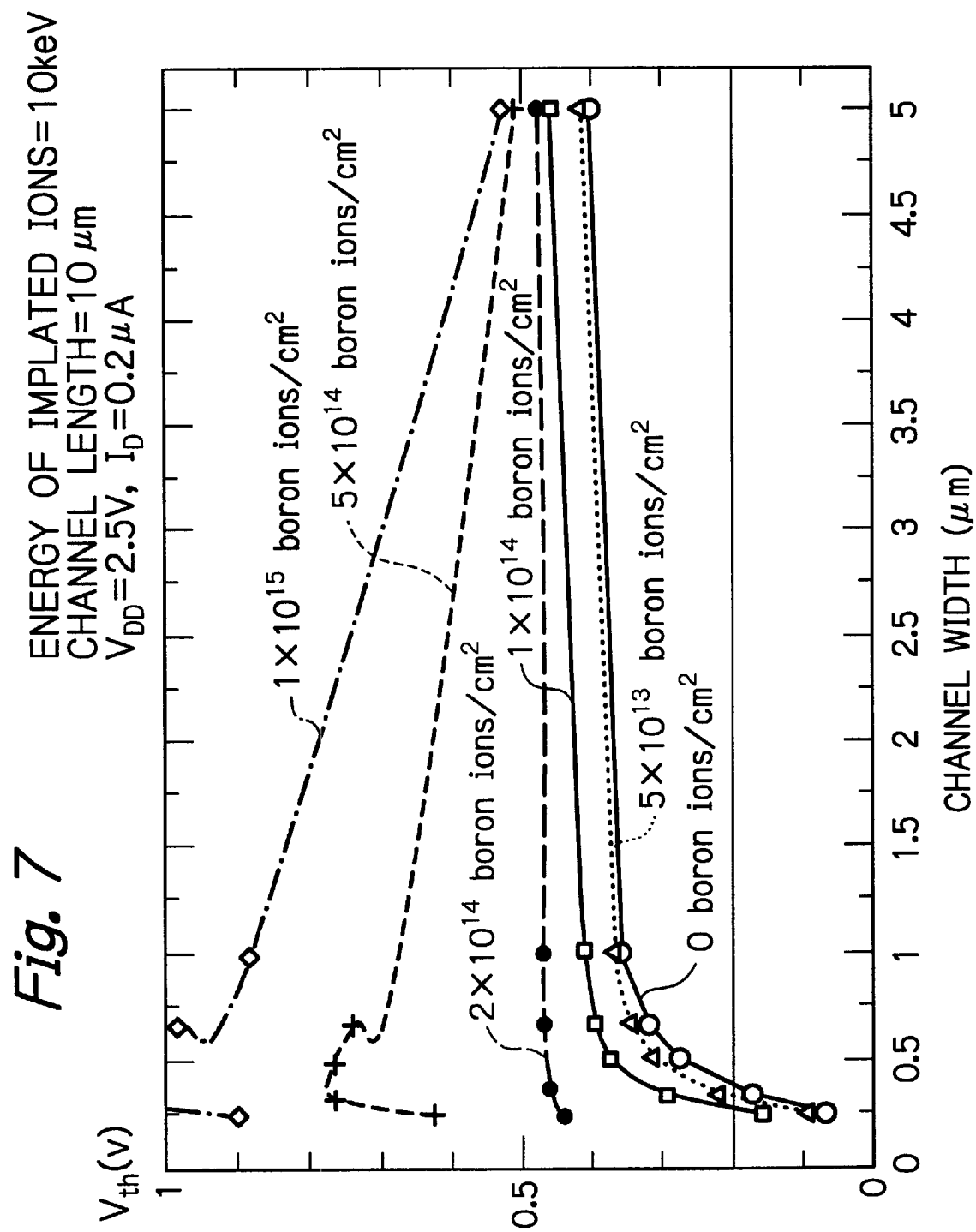

METHOD FOR MANUFACTURING SEMICONDUCTOR DEVICE CAPABLE OF SUPPRESSING NARROW CHANNEL WIDTH EFFECT

BACKGROUND OF THE INVENTION

1. Field of the Invention

The present invention relates to a method for manufacturing a semiconductor device such as a metal oxide semiconductor (MOS) transistor partitioned by a shallow trench isolation (STI) layer.

2. Description of the Related Art

When manufacturing a MOS transistor, impurities are introduced into a semiconductor substrate under a gate electrode, thus adjusting the threshold voltage of the MOS transistor. On the other hand, in a prior art manufacturing method, in order to partition MOS transistors from each other, an STI layer made of silicon oxide has been introduced. This will be explained later in detail.

In the above-described prior art method, however, when the channel width as well as the channel length has been reduced, a so-called narrow channel width effect becomes notable. For example, in an N-channel MOS transistor, boron atoms are introduced into a silicon substrate under a gate electrode to adjust the threshold voltage. In this case, boron atoms are segregated by the STI layer, so that the concentration of boron atoms is made lower at the ends of a channel in the width direction than at the center thereof. This decreases the threshold voltage of the N-channel MOS transistor.

Note that, in a P-channel MOS transistor, the same narrow channel width effect occurs. That is, arsenic or phosphorus ions are implanted to decrease the threshold voltage. In this case, arsenic or phosphorus atoms are also segregated by the STI layer, so that the concentration of arsenic or phosphorus atoms is made higher at the ends of a channel in the width direction than at the center thereof. This also decreases the threshold voltage of the P-channel MOS transistor.

SUMMARY OF THE INVENTION

It is an object of the present invention to provide a semiconductor device capable of suppressing the narrow channel width effect caused by an STI layer.

According to the present invention, in a method for manufacturing a semiconductor device, a shallow trench isolation layer made of silicon oxide is formed in a semiconductor substrate to partition an area for forming a MOS transistor. Then, first impurities are introduced into the MOS transistor forming area to adjust a threshold voltage of the MOS transistor. Then, second impurities are introduced into end portions of the MOS transistor forming area of the semiconductor substrate.

BRIEF DESCRIPTION OF THE DRAWINGS

The present invention will be more clearly understood from the description set forth below, as compared with the prior art, with reference to the accompanying drawings, wherein:

FIG. 7 is a graph showing the channel width to threshold voltage characteristics of the N-channel MOS transistor obtained by the method as illustrated in FIGS. 4A through 4K;

DESCRIPTION OF THE PREFERRED EMBODIMENTS

Before the description of the preferred embodiments, a prior art method for manufacturing a semiconductor device such as an N-channel MOS transistor will be explained with reference to FIGS. 1A through 1J, 2, 3A and 3B.

Figure 1A:
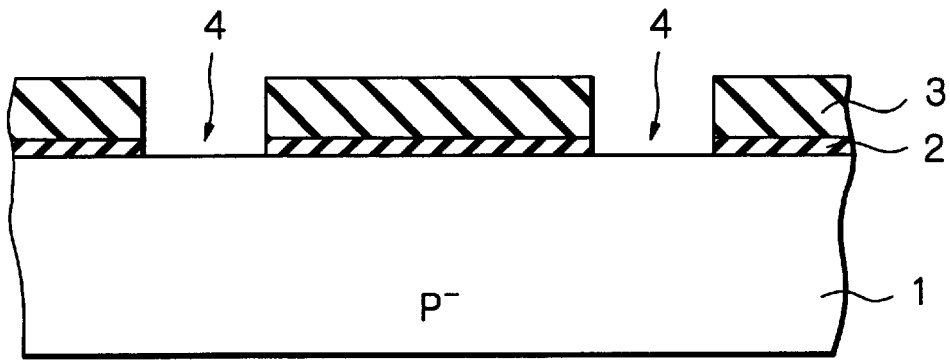
FIGS. 1A through 1J are cross-sectional views illustrating a prior art method for manufacturing a semiconductor device.

First, referring to FIG. 1A, a silicon oxide layer 2 and a silicon nitride layer 3 are deposited on a P$^-$-type monocrystalline silicon substrate 1. In this case, the silicon oxide layer 2 can be formed by thermally oxidizing the silicon substrate 1. Also, the silicon substrate 1 can be replaced by a P$^-$-type epitaxial silicon layer grown on an N$^-$-type monocrystalline silicon substrate. Then, an opening 4 is perforated in the silicon nitride layer 3 and the silicon oxide layer 2 by a photolithography and etching process.

Figure 1B:
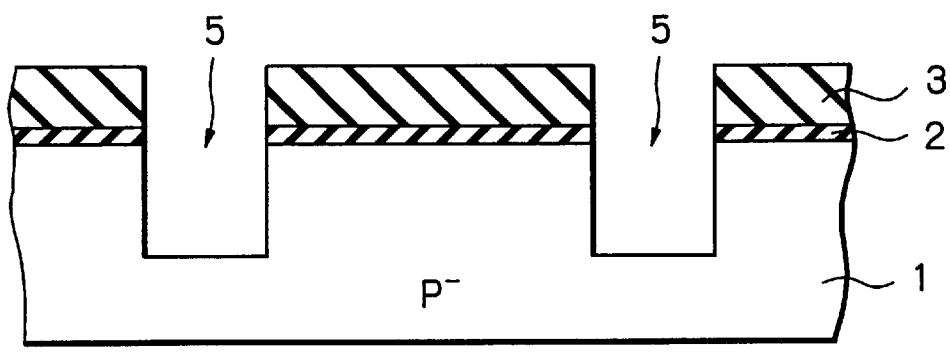

Next, referring to FIG. 1B, the silicon substrate 1 is etched by using the silicon nitride layer 3 and the silicon oxide layer 2 as a mask. As a result, a trench (groove) 5 is formed within the silicon substrate 1.

Figure 1C:
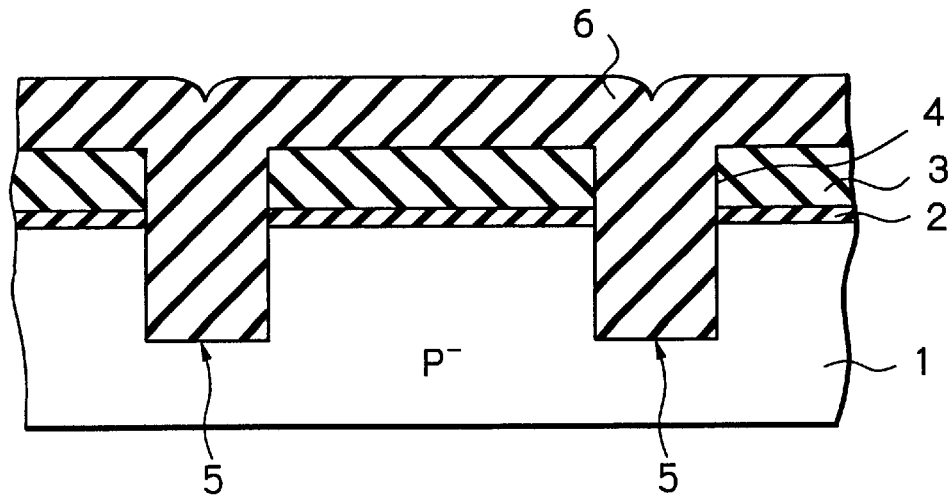

Next, referring to FIG. 1C, a silicon oxide layer 6 is buried in the trench 5 of the silicon substrate 1 and the opening 4 of the silicon nitride layer 3 and the silicon oxide layer 2 by a thermal oxidation process and a chemical vapor deposition (CVD) process.

Figure 1D:
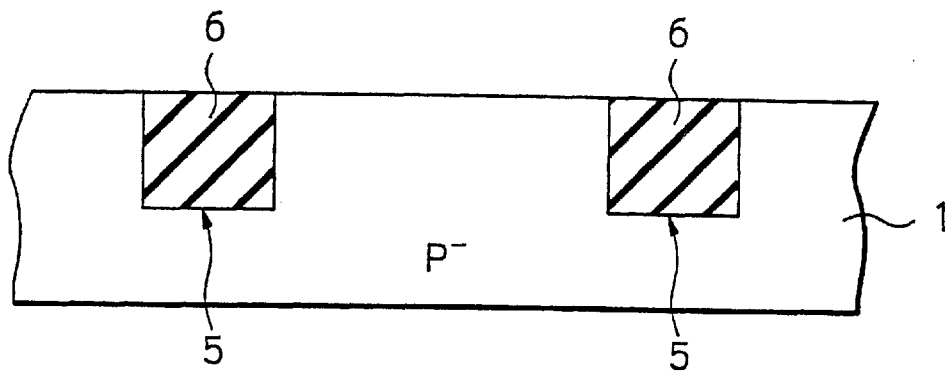

Next, referring to FIG. 1D, the silicon oxide layer 6, the silicon nitride layer 3 and the silicon oxide layer 2 are flattened by a chemical mechanical polishing (CMP) process. As a result, the silicon oxide layer 6 is left only within the trench 5. Thus, the silicon oxide layer 6 buried in the trench 5 serves as an STI layer, to partition element forming areas from each other.

Figure 1E:
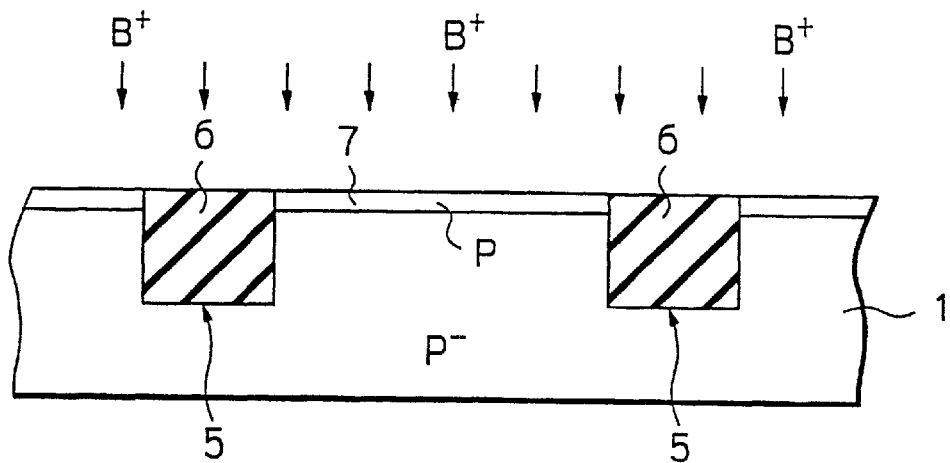

Next, referring to FIG. 1E, boron ions are implanted into the silicon substrate 1 to form a P-type impurity diffusion region 7 within the silicon substrate 1. Note that the P-type impurity diffusion region 7 is used for adjusting the threshold voltage of an N-channel MOS transistor which will be formed.

Figure 1F:
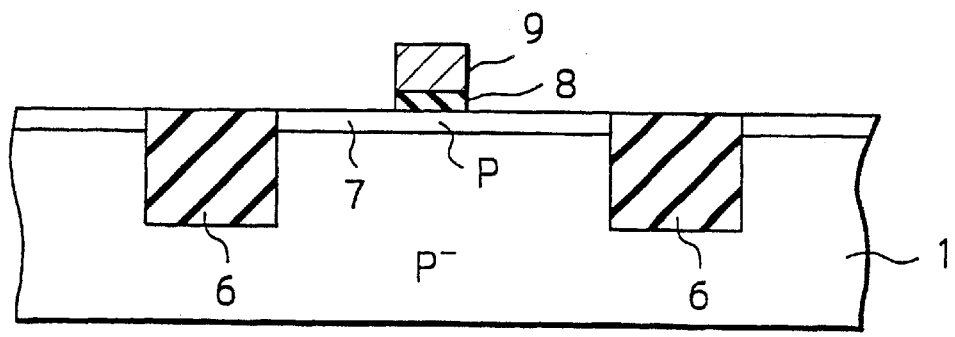

Next, referring to FIG. 1F, after the surface of the device is cleaned and rinsed, a silicon oxide layer is formed by thermally oxidizing the semiconductor substrate 1, and a polycrystalline silicon layer is deposited on the silicon oxide layer by a CVD process. Then, the polycrystalline silicon layer and the silicon oxide layer are patterned by a photolithography and etching process, so that a gate insulating layer 8 and a gate electrode layer 9 are formed.

Figure 1G:
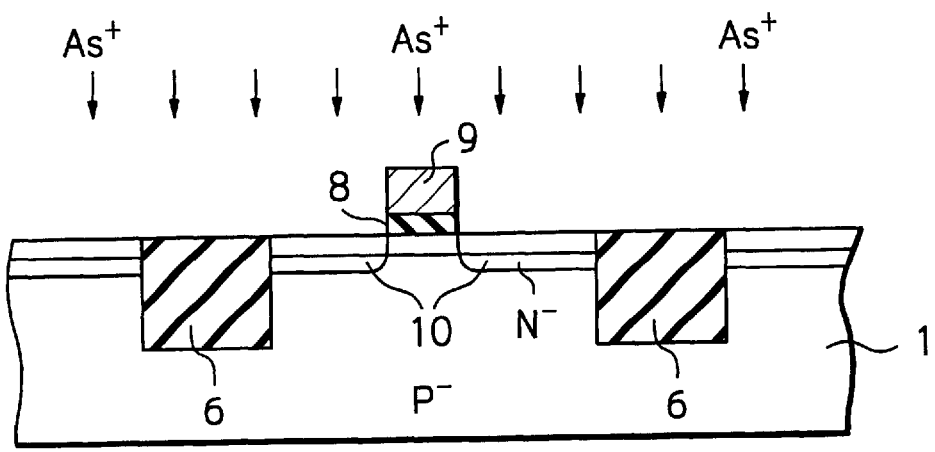

Next, referring to FIG. 1G, arsenic ions are implanted into the silicon substrate 1 by using the gate electrode 9 and the gate insulating layer 8 as a mask. As a result, an $N^-$-type impurity region 10 for a lightly doped drain (LDD) structure is formed within the silicon substrate 1.

Figure 1H:
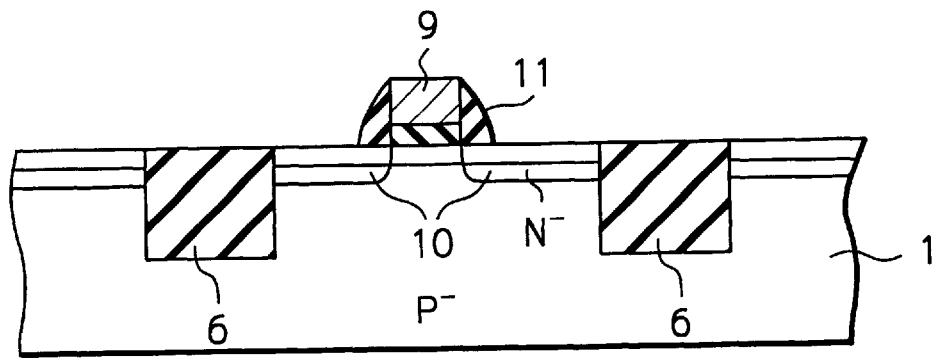

Next, referring to FIG. 1H, a silicon oxide layer is deposited on the entire surface by a CVD process, and the silicon oxide layer is etched back by an anisotropic etching process. As a result, a sidewall insulating layer 11 is formed on the sidewalls of the gate insulating layer 8 and the gate electrode 9.

Next, referring to FIG. 1I, arsenic ions are again implanted into the silicon substrate 1 by using the gate electrode 9, the gate insulating layer 8 and the sidewall insulating layer 11 as a mask. As a result, an $N^+$-type impurity region 12 for the LDD structure is formed within the silicon substrate 1.

Figure 1I:
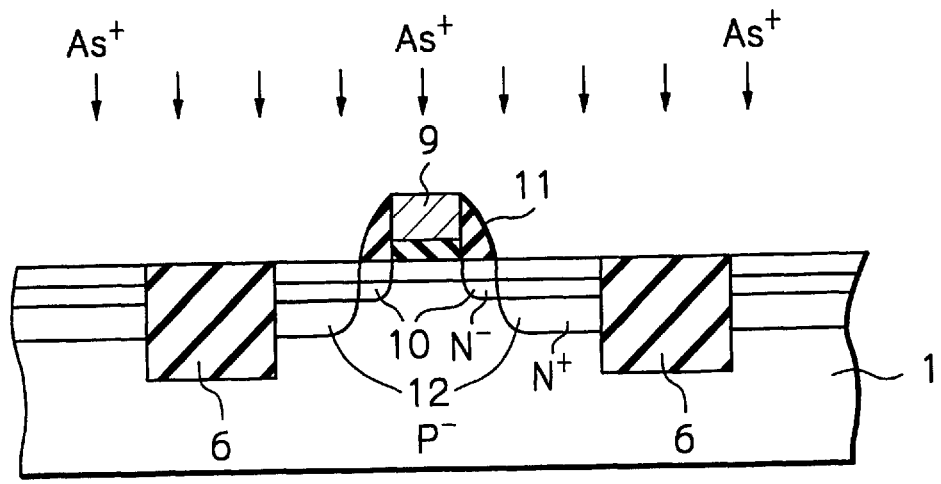
Figure 1J:
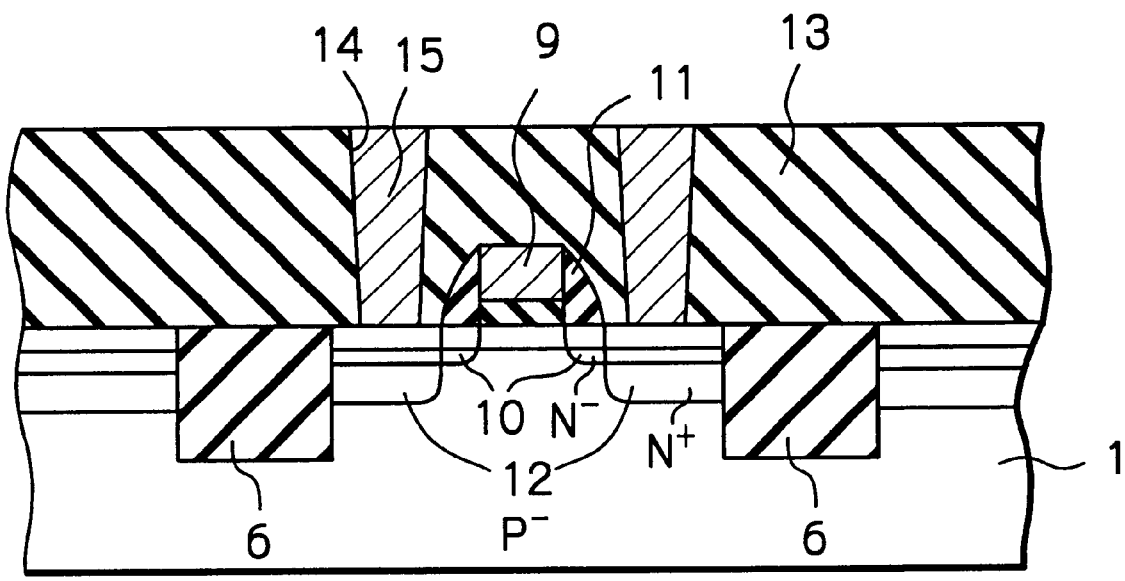

Finally, referring to FIG. 1J, an insulating layer 13 made of phospho-silicated glass (PSG) or boron-including PSG (BPSG) is formed on the entire surface. Then, contact holes 14 are perforated in the insulating layer 13, and contact plugs 15 made of polycrystalline silicon or the like are buried in the contact holes 14. In this case, a contact plug (not shown) is formed for the gate electrode 9. Then, wiring layers are formed on the contact plugs to complete the N-channel MOS transistor.

Figure 2:
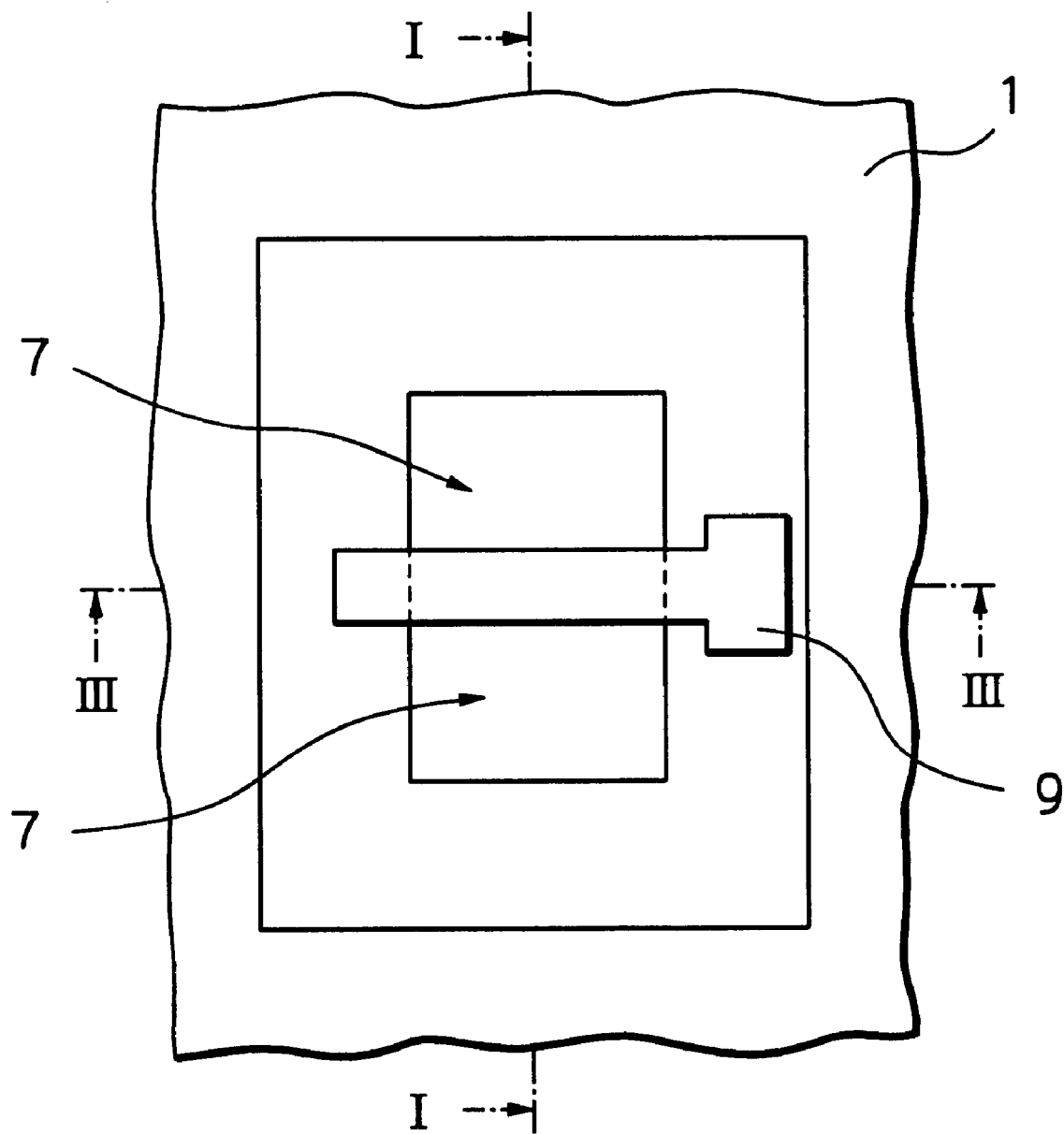
FIG. 2 is a plan view of the device of FIG. 1F.
Figure 3A:
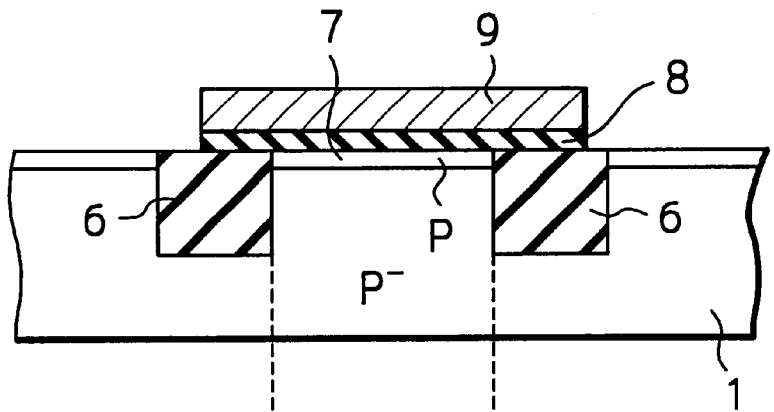
FIG. 3A is a cross-sectional view taken along the line III—III in FIG. 2.
Figure 3B:
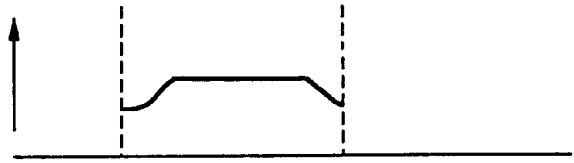
FIG. 3B is a graph showing the concentration of boron atoms in the P-type impurity diffusion region of FIG. 3A.

The problem of the method as illustrated in FIGS. 1A through 1J is explained next with FIGS. 2, 3A and 3B. Note that FIG. 2 is a plan view of the device of FIG. 1F, which in turn is a cross-sectional view taken along the line I—I in FIG. 2. Also, FIG. 3A is a cross-sectional view taken along the line III—III in FIG. 2, and FIG. 3B is a graph showing the concentration of boron atoms in the P-type impurity diffusion region 7 of FIG. 3A, after the P-type impurity diffusion region 7 is subjected to a heating or annealing process. That is, solid solubility of boron is larger in silicon oxide than in silicon. Therefore, boron atoms are moved by such a heating or annealing process from the silicon substrate 1 to the silicon oxide (STI) layer 6. As a result, boron atoms are segregated by the silicon oxide (STI) layer 6, so that the concentration of boron atoms is made lower at the ends of a channel in the width direction than at the center thereof, as shown in FIG. 3B. This decreases the threshold voltage of the N-channel MOS transistor, which can be called a narrow channel width effect.

When manufacturing a P-channel MOS transistor, the same narrow channel width effect occurs. That is, arsenic or phosphorus ions are implanted to form an N-type impurity region in a silicon substrate, thereby decreasing the threshold voltage. In this case, solid solubility of arsenic or phosphorus is smaller in silicon oxide than in silicon. Therefore, arsenic or phosphorus atoms are moved by a heating or annealing process from the silicon oxide (STI) layer to the silicon substrate. As a result, arsenic or phosphorus atoms are segregated by the silicon oxide (STI) layer, so that the concentration of arsenic or phosphorus atoms is made higher at the ends of a channel in the width direction than at the center thereof. This decreases the threshold voltage of the P-channel MOS transistor.

A first embodiment of the method for manufacturing a semiconductor device such as an N-channel MOS transistor will be explained next with reference to FIGS. 4A through 4K, 5, 6A and 6B.

Figure 4A:
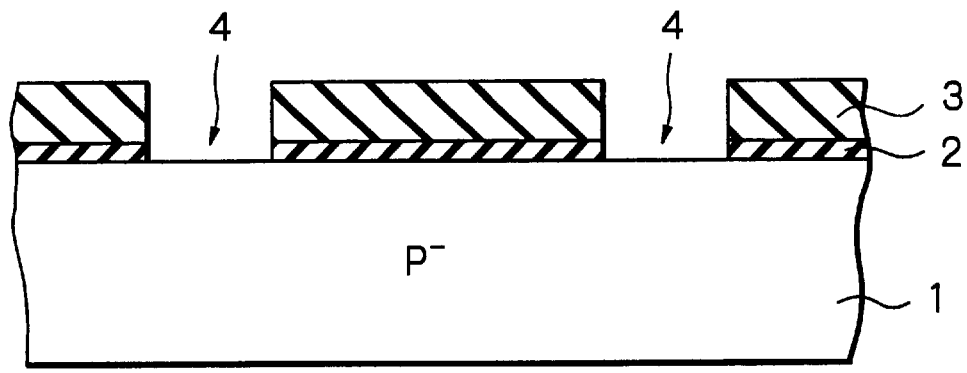
FIGS. 4A through 4K are cross-sectional views illustrating a first embodiment of the method for manufacturing a semiconductor device according to the present invention.

First, referring to FIG. 4A, in the same way as in FIG. 1A, a silicon oxide layer 2 and a silicon nitride layer 3 are deposited on a $P^-$-type monocrystalline silicon substrate 1. In this case, the silicon oxide layer 2 can be formed by thermally oxidizing the silicon substrate 1. Also, the silicon substrate 1 can be replaced by a $P^-$-type epitaxial silicon layer grown on an $N^-$-type monocrystalline silicon substrate. Then, an opening 4 is perforated in the silicon nitride layer 3 and the silicon oxide layer 2 by a photolithography and etching process.

Figure 4B:
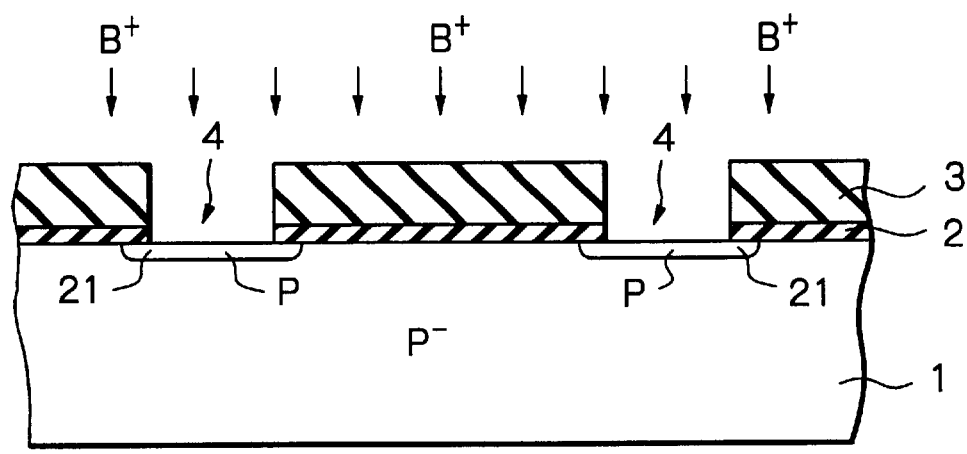

Next, referring to FIG. 4B, about $2 \times 10^{14}$ boron ions/cm² are implanted at an energy of about 10 keV and at a normal angle into the silicon substrate 1 by using the silicon nitride layer 3 and the silicon oxide layer 2 as a mask. As a result, a P-type impurity diffusion region 21 is formed at the bottom of the opening 4 and beneath the silicon oxide layer 2. That is, since boron ions have a large diffusion coefficient for the silicon substrate 1, boron ions are easily diffused into the silicon substrate 1 along the horizontal and vertical directions.

Figure 4C:
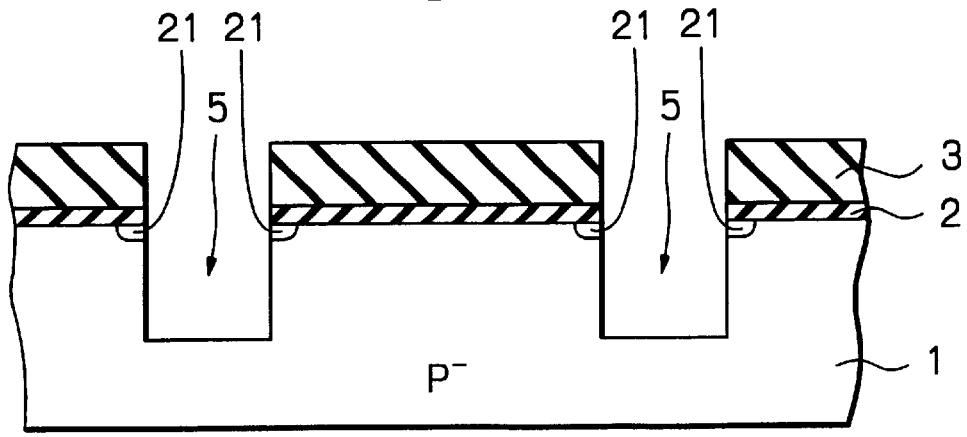

Next, referring to FIG. 4C, in the same way as in FIG. 1B, the silicon substrate 1 is etched by using the silicon nitride layer 3 and the silicon oxide layer 2 as a mask. As a result, a trench (groove) 5 is formed within the silicon substrate 1.

Figure 4D:
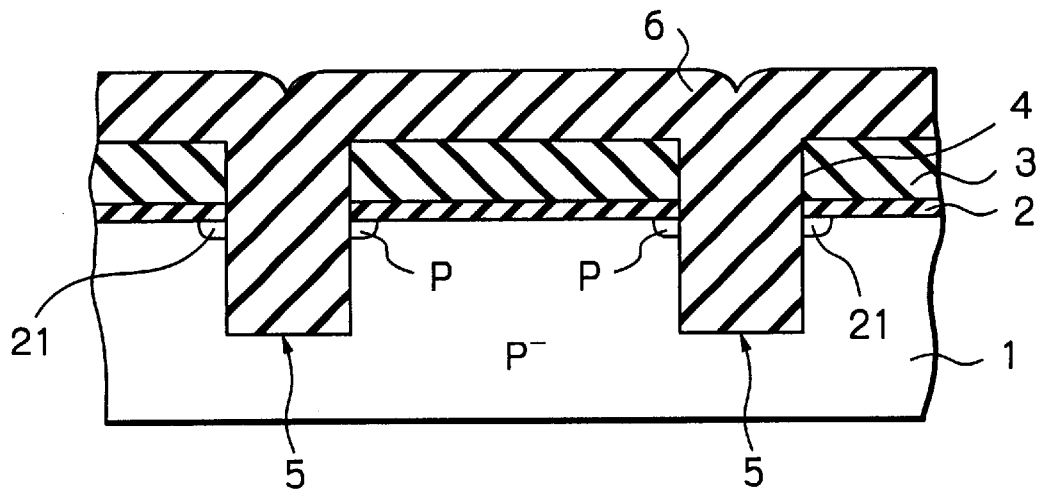

Next, referring to FIG. 4D, in the same way as in FIG. 1C, a silicon oxide layer 6 is buried in the trench 5 of the silicon substrate 1 and the opening 4 of the silicon nitride layer 3 and the silicon oxide layer 2 by a thermal oxidation process and a CVD process.

Figure 4E:
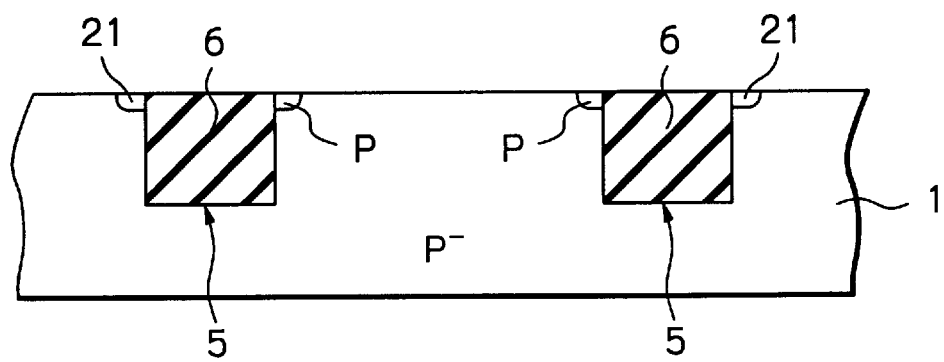

Next, referring to FIG. 4E, in the same way as in FIG. 1D, the silicon oxide layer 6, the silicon nitride layer 3 and the silicon oxide layer 2 are flattened by a CMP process. As a result, the silicon oxide layer 6 is left only within the trench 5. Thus, the silicon oxide layer 6 buried in the trench 5 serves as an STI layer, to partition element forming areas from each other.

Figure 4F:
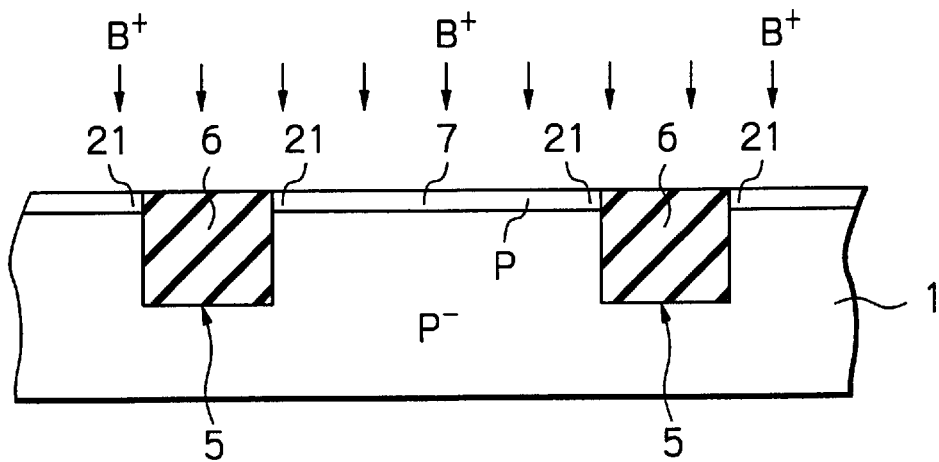

Next, referring to FIG. 4F, in the same way as in FIG. 1E, about $8 \times 10^{12}$ boron ions/cm$^2$ are implanted at an energy of about 50 keV into the silicon substrate 1 to form a P-type impurity diffusion region 7 within the silicon substrate 1. Note that the P-type impurity diffusion region 7 including the P-type impurity diffusion region 21 is used for adjusting the threshold voltage of an N-channel MOS transistor which will be formed.

Figure 4G:
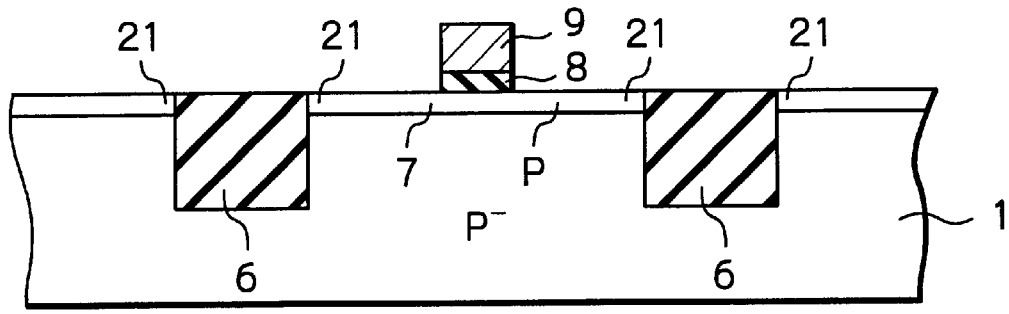

Next, referring to FIG. 4G, in the same way as in FIG. 1F, after the surface of the device is cleaned and rinsed, a silicon oxide layer is formed by thermally oxidizing the semiconductor substrate 1, and a polycrystalline silicon layer is deposited on the silicon oxide layer by a CVD process. Then, the polycrystalline silicon layer and the silicon oxide layer are patterned by a photolithography and etching process, so that a gate insulating layer 8 and a gate electrode layer 9 are formed.

Figure 4H:
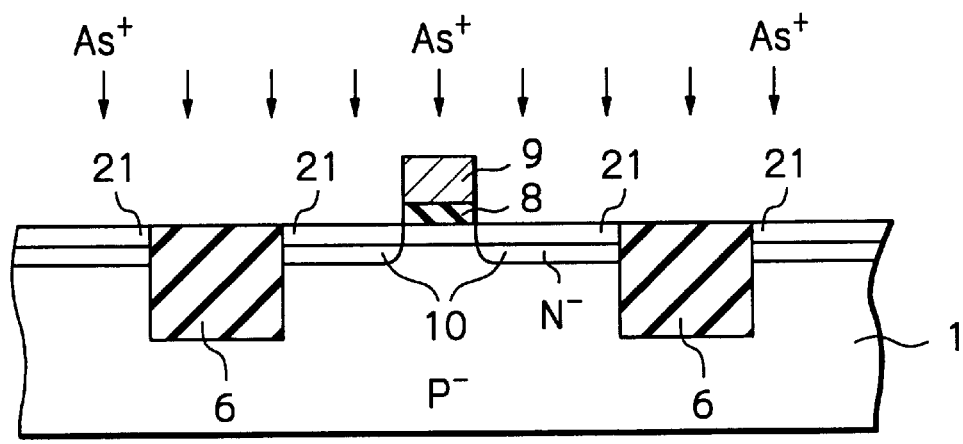

Next, referring to FIG. 4H, in the same way as in FIG. 1G, about $3 \times 10^{14}$ arsenic ions/cm$^2$ are implanted at an energy of about 30 keV into the silicon substrate 1 by using the gate electrode 9 and the gate insulating layer 8 as a mask. As a result, an N$^-$-type impurity region 10 for an LDD structure is formed within the silicon substrate 1.

Figure 4I:
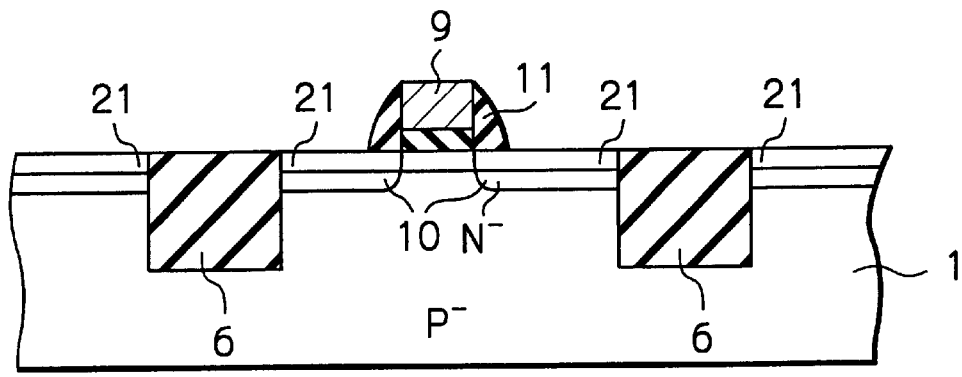

Next, referring to FIG. 4I, in the same way as in FIG. 1H, a silicon oxide layer is deposited on the entire surface by a CVD process, and the silicon oxide layer is etched back by an anisotropic etching process. As a result, a sidewall insulating layer 11 is formed on the sidewalls of the gate insulating layer 8 and the gate electrode layer 9.

Figure 4J:
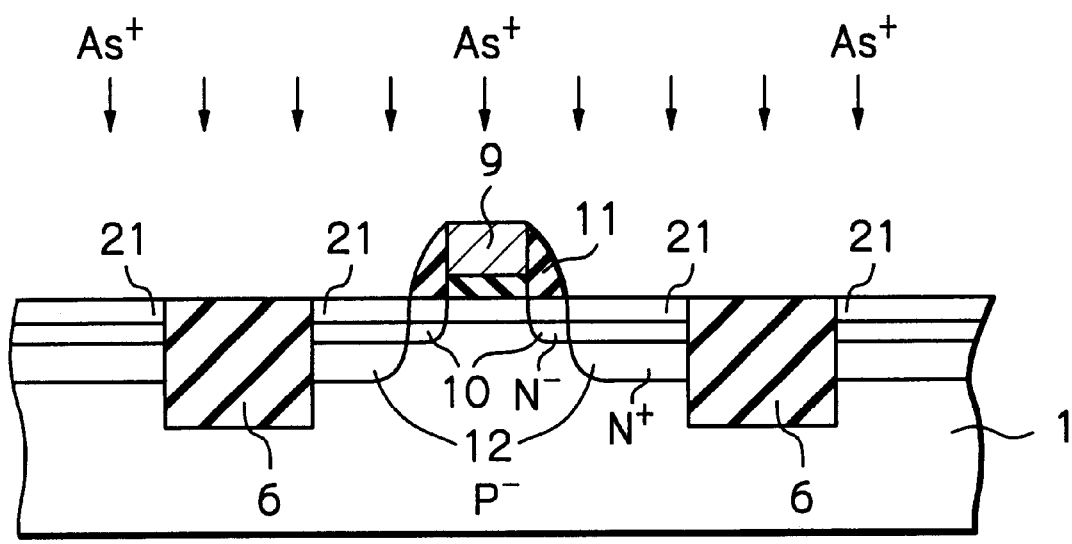

Next, referring to FIG. 4J, in the same way as in FIG. 1I, about $3 \times 10^{15}$ arsenic ions/cm$^2$ are again implanted at an energy of about 30 keV into the silicon substrate 1 by using the gate electrode 9, the gate insulating layer 8 and the sidewall insulating layer 11 as a mask. As a result, an N$^+$-type impurity region 12 for the LDD structure is formed within the silicon substrate 1.

Figure 4K:
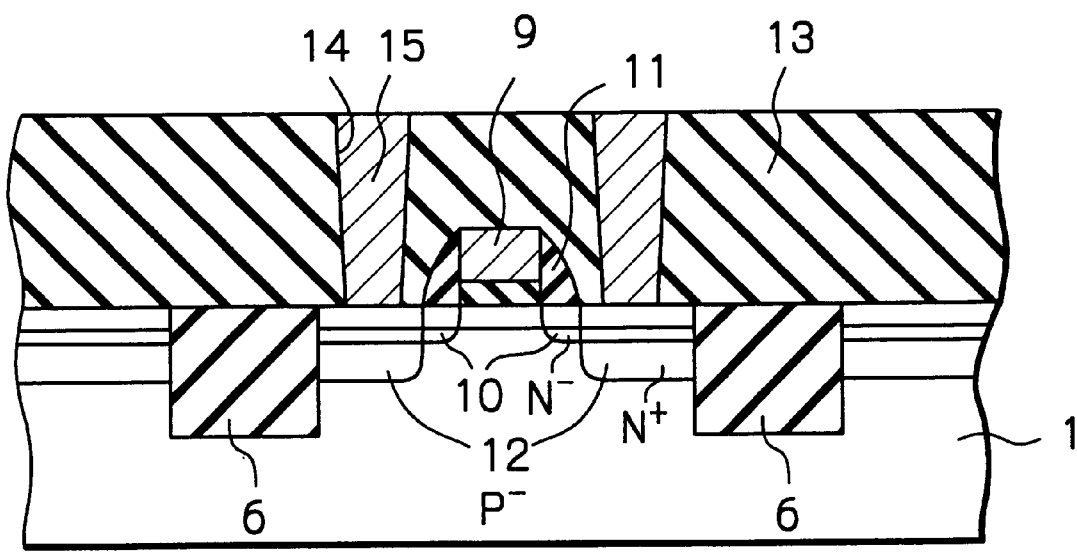

Finally, referring to FIG. 4K, in the same way as in FIG. 1J, an insulating layer 13 made of PSG or BPSG is formed on the entire surface. Then, contact holes 14 are perforated in the insulating layer 13, and contact plugs 15 made of polycrystalline silicon or the like are buried in the contact holes 14. In this case, a contact plug (not shown) is formed for the gate electrode layer 9. Then, wiring layers are formed on the contact plugs to complete the N-channel MOS transistor.

Figure 5:
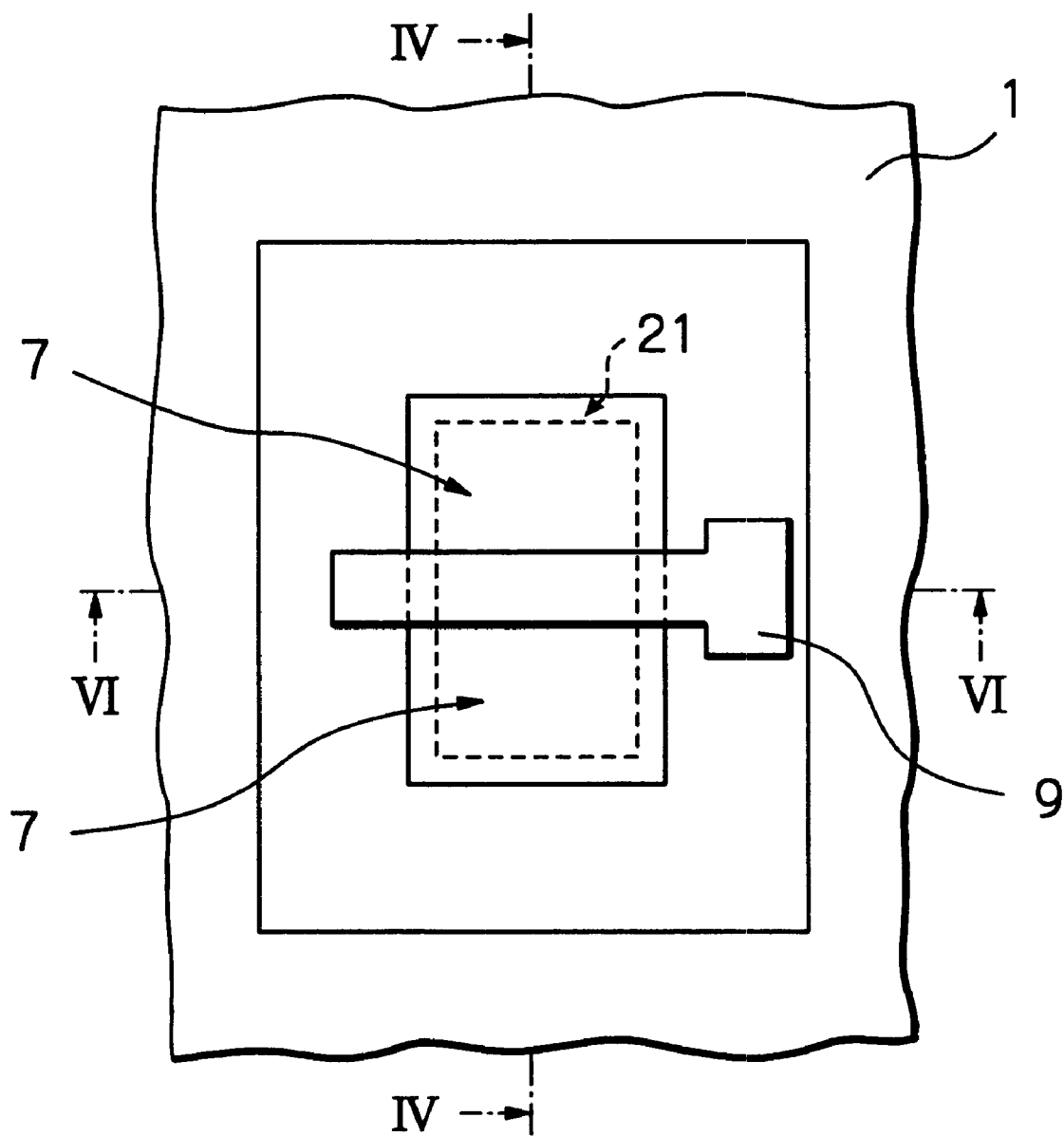
FIG. 5 is a plan view of the device of FIG. 4G.
Figure 6A:
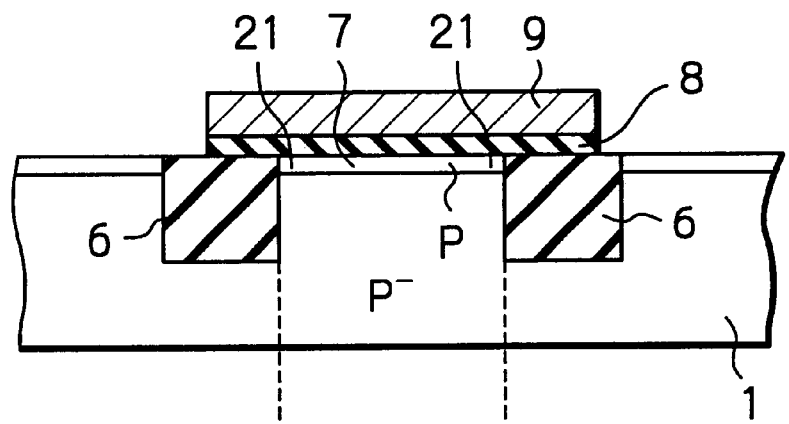
FIG. 6A is a cross-sectional view taken along the line VI—VI in FIG. 5.
Figure 6B:
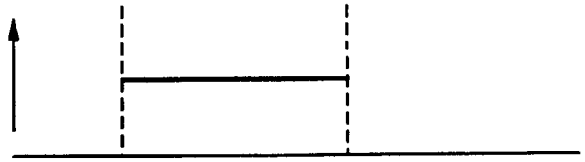
FIG. 6B is a graph showing the concentration of boron atoms in the P-type impurity diffusion region of FIG. 6A.

The effect of the method as illustrated in FIGS. 4A through 4K is explained next with FIGS. 5, 6A and 6B. Note that FIG. 5 is a plan view of the device of FIG. 4G, which in turn is a cross-sectional view taken along the line IV—IV in FIG. 5. Also, FIG. 6A is a cross-sectional view taken along the line VI—VI in FIG. 5, and FIG. 6B is a graph showing the concentration of boron atoms in the P-type impurity diffusion region 7 including the P-type impurity diffusion region 21 of FIG. 6A, after the P-type impurity diffusion region 7 including the P-type impurity diffusion region 21 is subjected to a heating or annealing process. That is, solid solubility of boron is larger in silicon oxide than in silicon. Therefore, boron atoms are moved by such a heating or annealing process from the silicon substrate 1 to the silicon oxide (STI) layer 6. In this case, however, even if boron atoms are segregated by the silicon oxide (STI) layer 6, since the concentration of boron atoms at the ends of a channel in the width direction is enhanced by the P-type impurity diffusion region 21, the concentration of boron atoms at the ends of the channel in the width direction is made equal to that at the center thereof, as shown in FIG. 6B. This does not decrease the threshold voltage of the N-channel MOS transistor, thus suppressing the narrow channel width effect.

As shown in FIG. 7, if the concentration of boron atoms in the P-type impurity diffusion region 21 is too high, the threshold voltage of the N-channel MOS transistor is too high. Therefore, it is important to determine the optimum concentration of implanted boron atoms. Note that the channel width to threshold voltage characteristics of FIG. 7 were obtained under the condition that the energy of implanted boron ions is 10 keV, the channel length is 10 $\mu$m, the source-to-drain voltage $V_{DD}$ is 2.5 V, the drain current $I_D$ is 0.2 $\mu$m.

Figure 8:
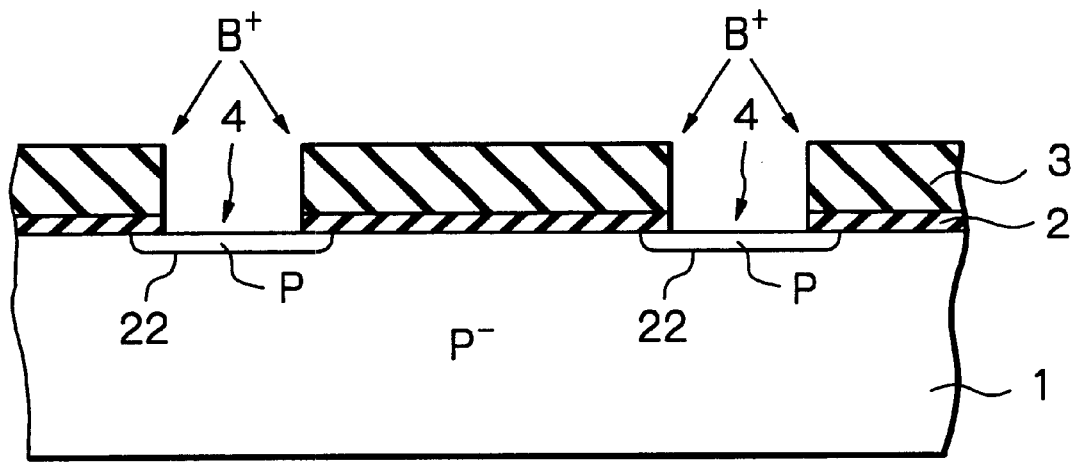
FIG. 8 is a cross-sectional view illustrating a first modification of the first embodiment according to the present invention.

In FIG. 8, which illustrates a first modification of the first embodiment of the present invention, instead of implanting boron ions at a normal angle as illustrated in FIG. 4B, about $2 \times 10^{14}$ boron ions/cm$^2$ are implanted at an energy of about 10 keV and at an incident angle such as 30° to 45° into the silicon substrate 1 by using the silicon nitride layer 3 and the silicon oxide layer 2 as a mask, while the wafer (the silicon substrate 1) is rotating. As a result, a P-type impurity diffusion region 22 is further deeply formed beneath the silicon oxide layer 2, thus further suppressing the narrow channel width effect.

Figure 9:
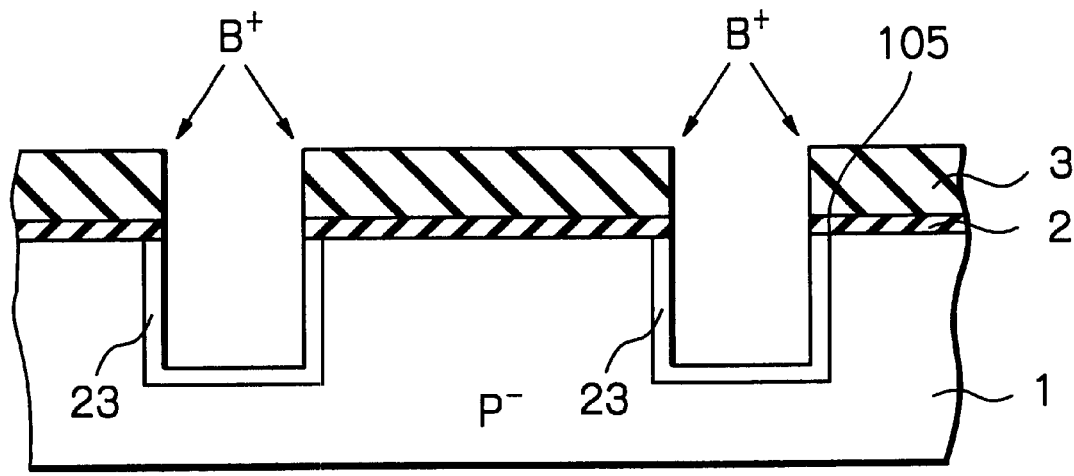
FIG. 9 is a cross-sectional view illustrating a second modification of the first embodiment according to the present invention.

In FIG. 9, which illustrates a second modification of the first embodiment of the present invention, instead of implanting boron ions at a normal angle as illustrated in FIG. 4B, after the trench (groove) 5 is formed at a step as illustrated in FIG. 4C, about $2 \times 10^{14}$ boron ions/cm$^2$ are implanted at an energy of about 10 keV and at an incident angle such as 30° to 45° into the silicon substrate 1 by using the silicon nitride layer 3 and the silicon oxide layer 2 as a mask, while the wafer (the silicon substrate 1) is rotating. As a result, a P-type impurity diffusion region 23 is further deeply formed beneath the silicon oxide layer 2, thus further suppressing the narrow channel width effect.

A second embodiment of the method for manufacturing a semiconductor device such as an N-channel MOS transistor will be explained next with reference to FIGS. 10A through 10G, 11A and 11B.

Figure 10A:
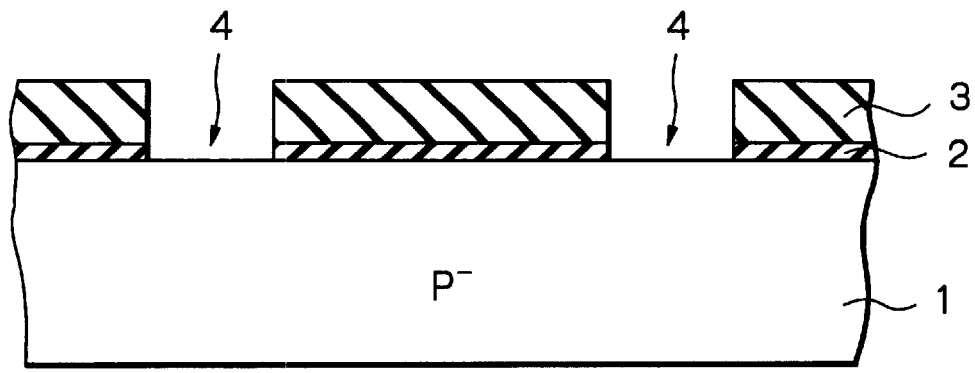
FIGS. 10A through 10G are cross-sectional views illustrating a second embodiment of the method for manufacturing a semiconductor device according to the present invention.

First, referring to FIG. 10A, in the same way as in FIG. 1A, a silicon oxide layer 2 and a silicon nitride layer 3 are deposited on a P$^-$-type monocrystalline silicon substrate 1. In this case, the silicon oxide layer 2 can be formed by thermally oxidizing the silicon substrate 1. Also, the silicon substrate 1 can be replaced by a P$^-$-type epitaxial silicon layer grown on an N$^-$-type monocrystalline silicon substrate. Then, an opening 4 is perforated in the silicon nitride layer 3 and the silicon oxide layer 2 by a photolithography and etching process.

Figure 10B:
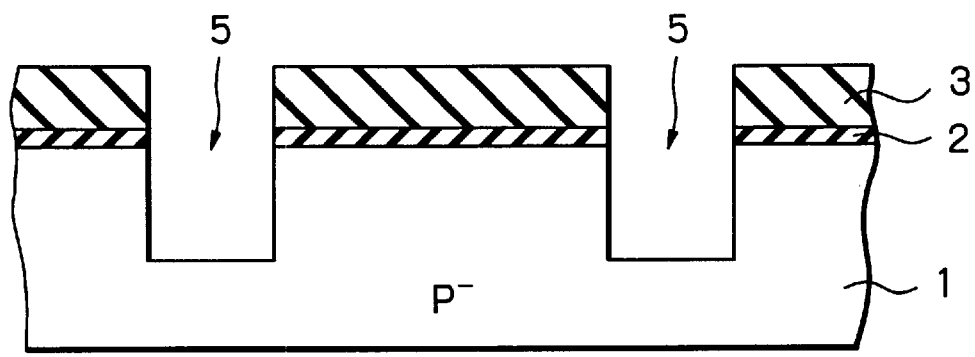

Next, referring to FIG. 10B, in the same way as in FIG. 1B, the silicon substrate 1 is etched by using the silicon nitride layer 3 and the silicon oxide layer 2 as a mask. As a result, a trench (groove) 5 is formed within the silicon substrate 1.

Figure 10C:
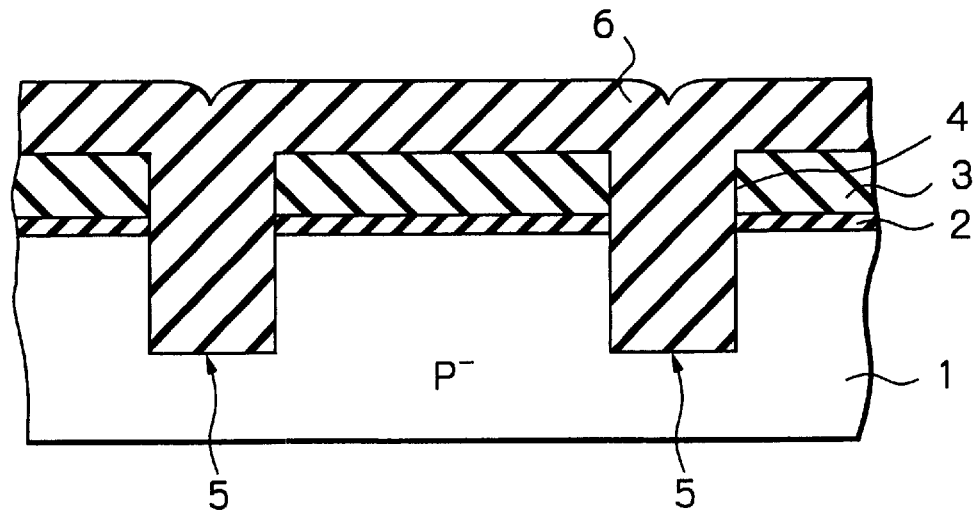

Next, referring to FIG. 10C, in the same way as in FIG. 1C, a silicon oxide layer 6 is buried in the trench 5 of the silicon substrate 1 and the opening 4 of the silicon nitride layer 3 and the silicon oxide layer 2 by a thermal oxidation process and a CVD process.

Figure 10D:
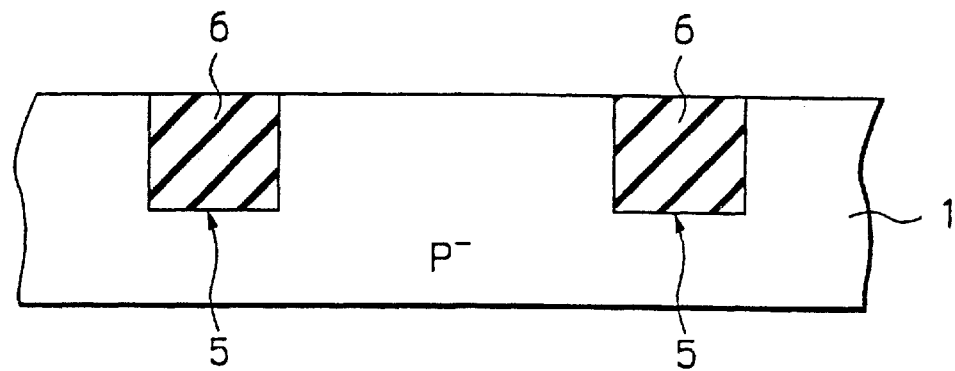

Next, referring to FIG. 10D, in the same way as in FIG. 1D, the silicon oxide layer 6, the silicon nitride layer 3 and the silicon oxide layer 2 are flattened by a CMP process. As a result, the silicon oxide layer 6 is left only within the trench 5. Thus, the silicon oxide layer 6 buried in the trench 5 serves as an STI layer, to partition element forming areas from each other.

Figure 10E:
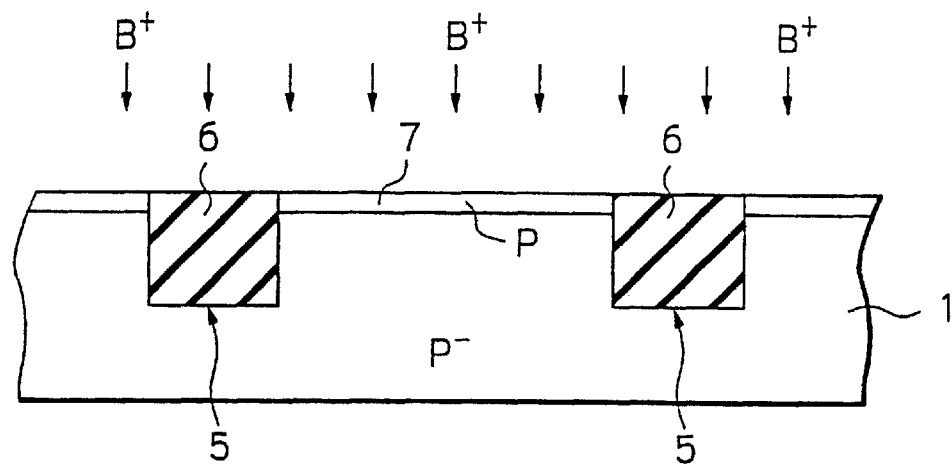

Next, referring to FIG. 10E, in the same way as in FIG. 1E, about $8 \times 10^{12}$ boron ions/cm$^2$ are implanted at an energy of about 50 keV into the silicon substrate 1 to form a P-type impurity diffusion region 7 within the silicon substrate 1. Note that the P-type impurity diffusion region 7 is used for adjusting the threshold voltage of an N-channel MOS transistor which will be formed.

Figure 10F:
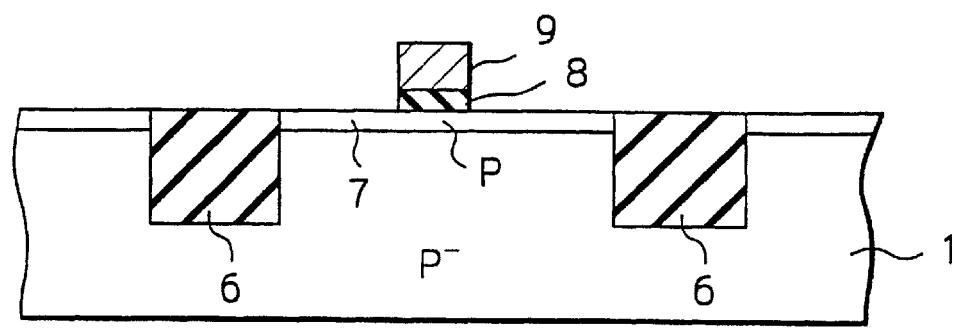

Next, referring to FIG. 10F, in the same way as in FIG. 1F, after the surface of the device is cleaned and rinsed, a silicon oxide layer is formed by thermally oxidizing the semiconductor substrate 1, and a polycrystalline silicon layer is deposited on the silicon oxide layer by a CVD process. Then, the polycrystalline silicon layer and the silicon oxide layer are patterned by a photolithography and etching process, so that a gate insulating layer 8 and a gate electrode layer 9 are formed.

Figure 10G:
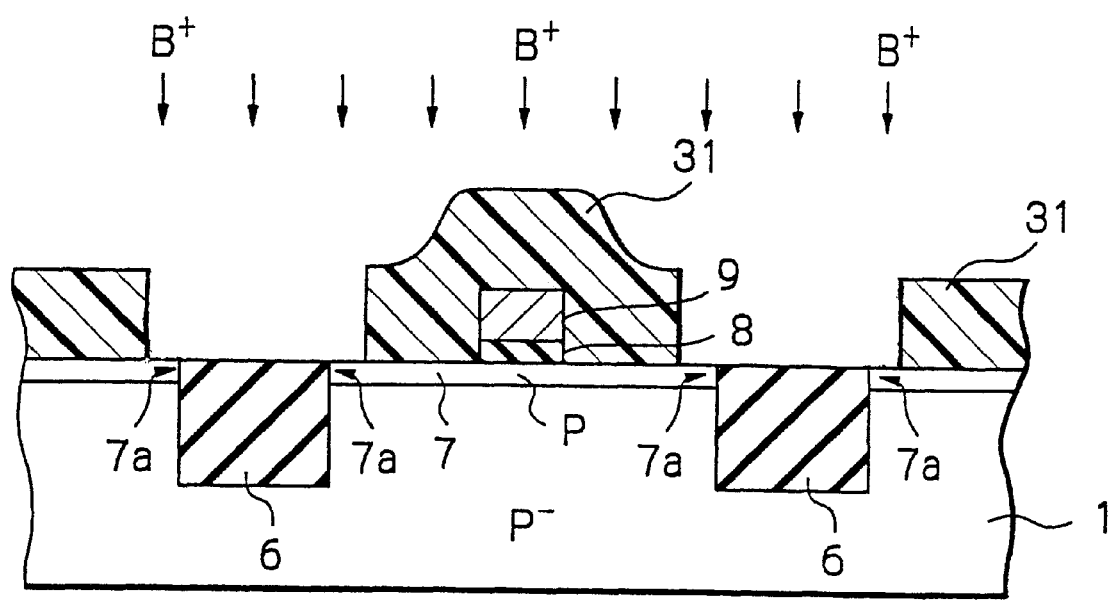
Figure 11A:
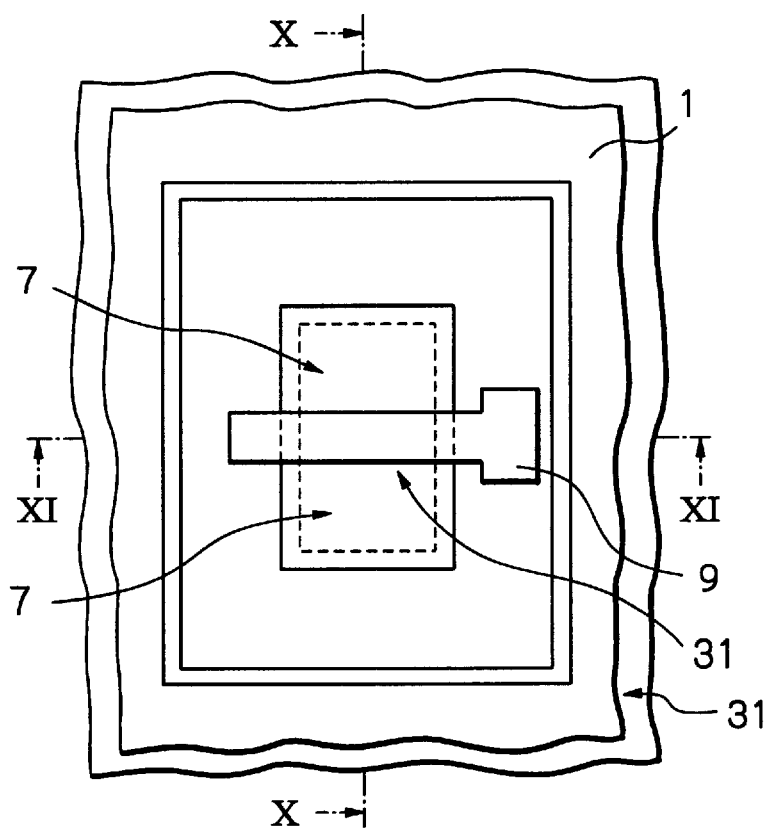
FIG. 11A is a plan view of the device of FIG. 10G.
Figure 11B:
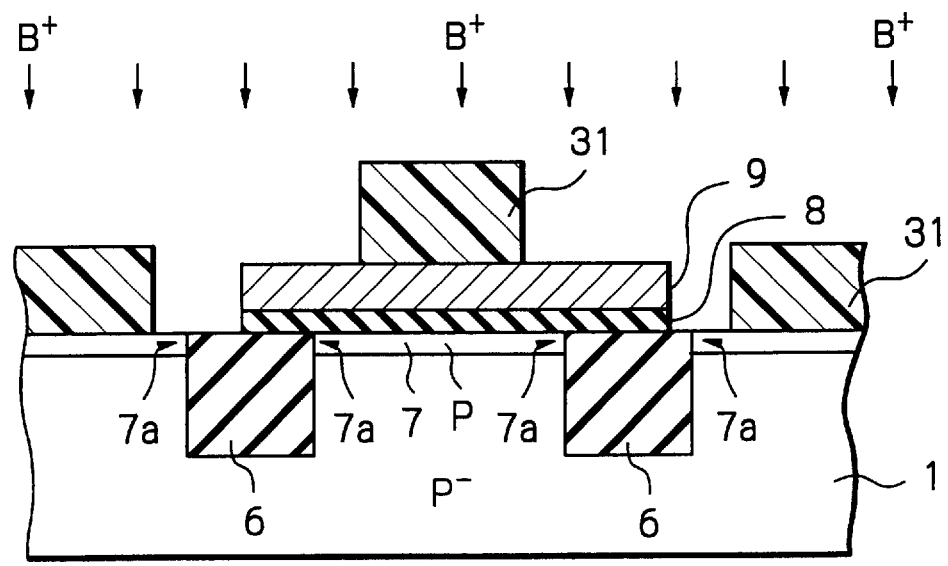
FIG. 11B is a cross-sectional view taken along the line XI—XI in FIG. 11A.

Next, referring to FIG. 10G, a photoresist pattern 31 is formed by a photolithography process. Note that FIG. 11A is a plan view of FIG. 10G which is a cross-sectional view taken along the line X—X in FIG. 11A, and FIG. 11B is a cross-sectional view taken along the line XI—XI in FIG. 11A. That is, the photoresist pattern 31 is perforated to expose the STI layer 6, and therefore, the photoresist pattern 31 can be formed by using the same photomask used for forming the opening 4 as illustrated in FIG. 4. In this case, the irradiation amount or the resist material is adjusted, so that the edge of the photoresist pattern 31 can be made to recede from the edge of the STI layer 6.

Then, about $2 \times 10^{14}$ boron ions/cm$^2$ are implanted at an energy of about 30 keV and at a normal angle into the silicon substrate 1 by using the photoresist pattern 31 as a mask. In this case, since the implanted boron ions need to penetrate the gate electrode layer 9 and the gate insulating layer 8, the energy of the implanted boron ions is larger than that in the first embodiment as illustrated in FIG. 4B. As a result, the concentration of boron ions of the P-type impurity diffusion region 7 at the periphery area 7a of the STI layer 6 is enhanced.

Thereafter, in the same way as in FIG. 1G, an N$^-$-type impurity region 10 for an LDD structure is formed within the silicon substrate 1. Then, in the same way as in FIG. 1H, a sidewall insulating layer 11 is formed on the sidewalls of the gate insulating layer 8 and the gate electrode layer 9. Then, in the same way as in FIG. 11, an N$^+$-type impurity region 12 for the LDD structure is formed within the silicon substrate 1. Then, in the same way as in FIG. 1J, an insulating layer 13 made of PSG or BPSG is formed on the entire surface. Then, contact holes 14 are perforated in the insulating layer 13, and contact plugs 15 made of polycrystalline silicon or the like are buried in the contact holes 14. Finally, wiring layers are formed on the contact plugs to complete the N-channel MOS transistor.

Even in the second embodiment, even if boron atoms are segregated by the silicon oxide (STI) layer 6, since the concentration of boron atoms at the ends 7a of a channel in the width direction is enhanced, the concentration of boron atoms at the ends of the channel in the width direction is made equal to that at the center thereof. This does not decrease the threshold voltage of the N-channel MOS transistor, thus suppressing the narrow channel width effect.

Figure 12A:
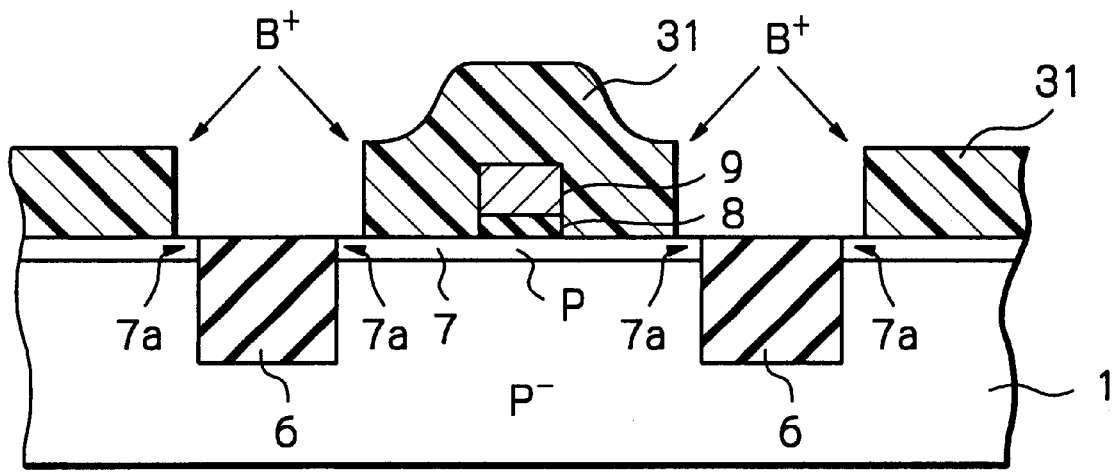
FIGS. 12A and 12B are cross-sectional views illustrating a first modification of the second embodiment according to the present invention.
Figure 12B:
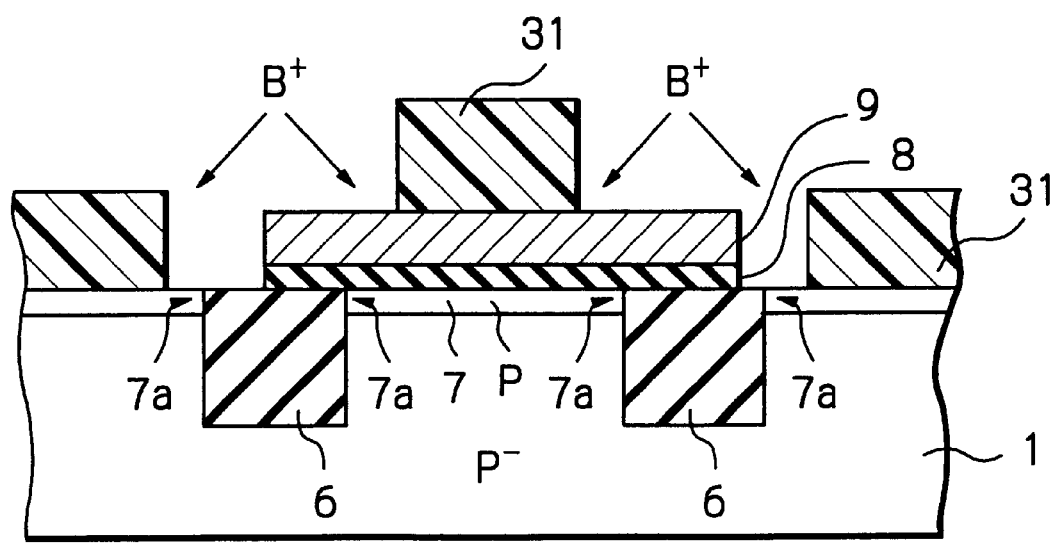

In FIGS. 12A and 12B, which illustrate a first modification of the second embodiment of the present invention, instead of implanting boron ions at a normal angle as illustrated in FIGS. 10G and 11B, which correspond to FIGS. 12A and 12B, respectively, about $2 \times 10^{14}$ boron ions/cm$^2$ are implanted at an energy of about 30 keV and at an incident angle such as 30° to 45° into the silicon substrate 1 by using the silicon nitride layer 3, the silicon oxide layer 2 and the photoresist pattern 31 as a mask, while the wafer (the silicon substrate 1) is rotating. As a result, the P-type impurity diffusion region 7 is further deeply formed at the ends 7a beneath the silicon oxide layer 2, thus further suppressing the narrow channel width effect.

Figure 13A:
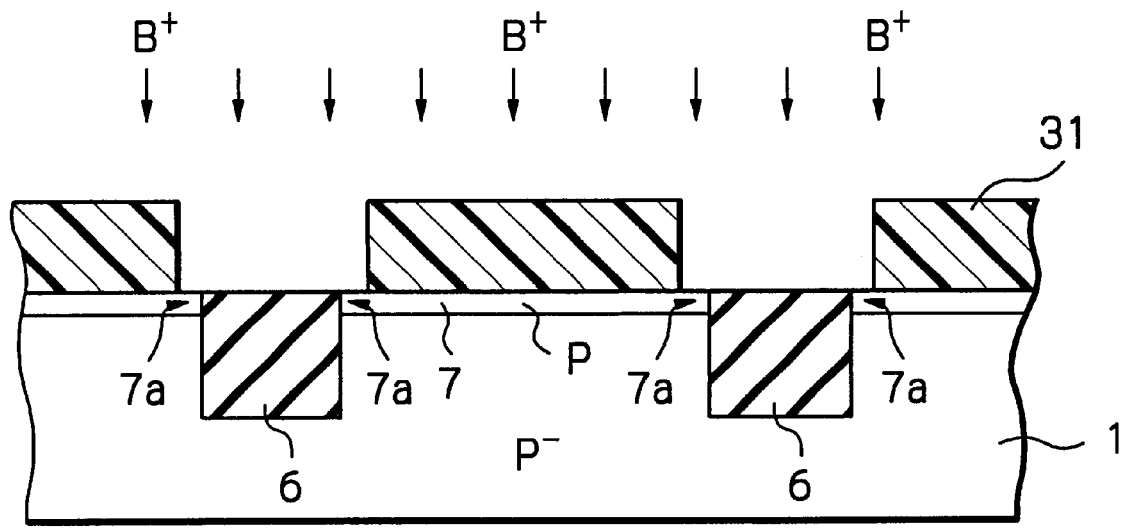
FIGS. 13A and 13B are cross-sectional views illustrating a second modification of the second embodiment according to the present invention.
Figure 13B:
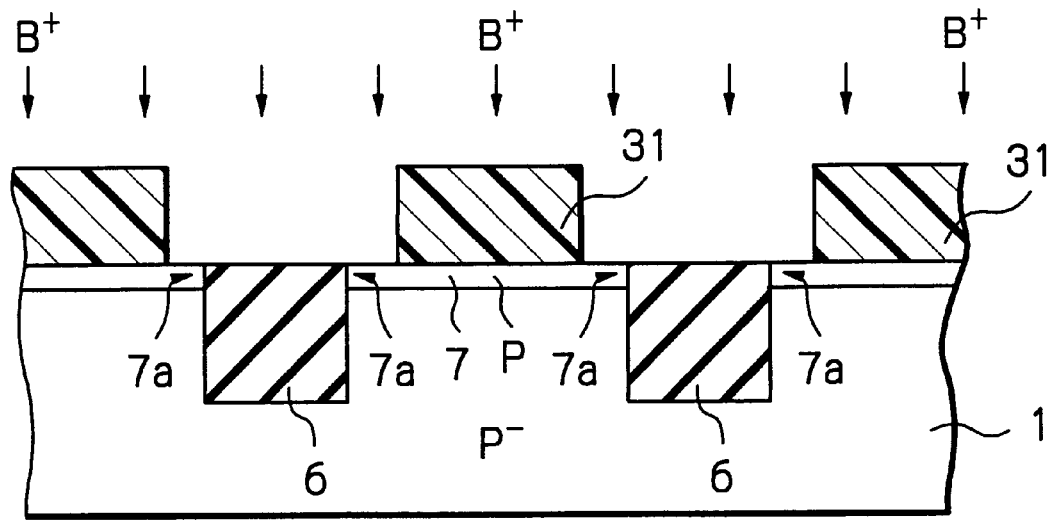

In FIGS. 13A and 13B, which illustrate a second modification of the second embodiment of the present invention, instead of implanting boron ions after the formation of the gate insulating layer 8 and the gate electrode layer 9 at a step as illustrated in FIGS. 10G and 11B, about $2 \times 10^{14}$ boron ions/cm$^2$ are implanted at an energy of about 30 keV and at a normal angle into the silicon substrate 1 by using the photoresist pattern 31 as a mask before the formation of the gate insulating layer 8 and the gate electrode layer 9.

Figure 14A:
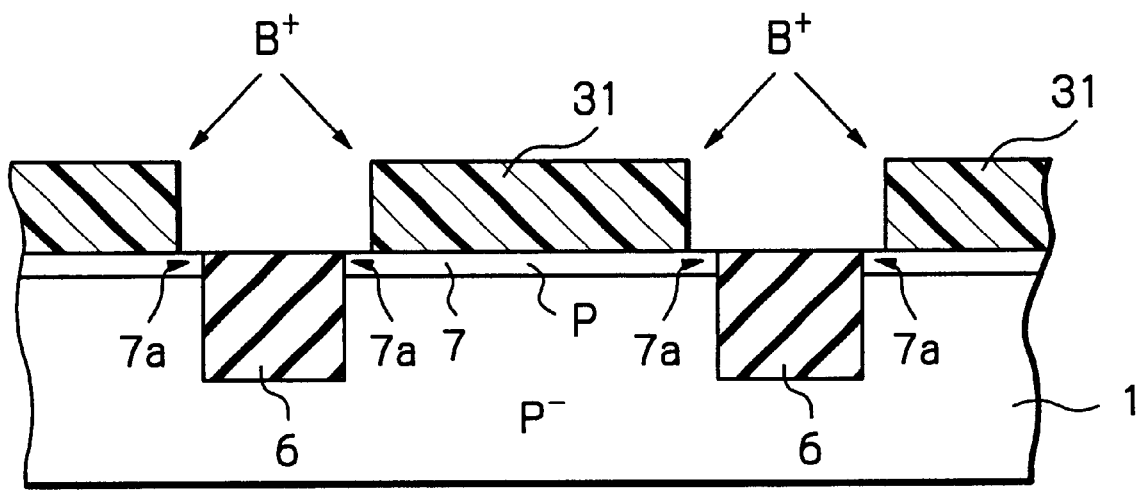
FIGS. 14A and 14B are cross-sectional views illustrating a third modification of the second embodiment according to the present invention.
Figure 14B:
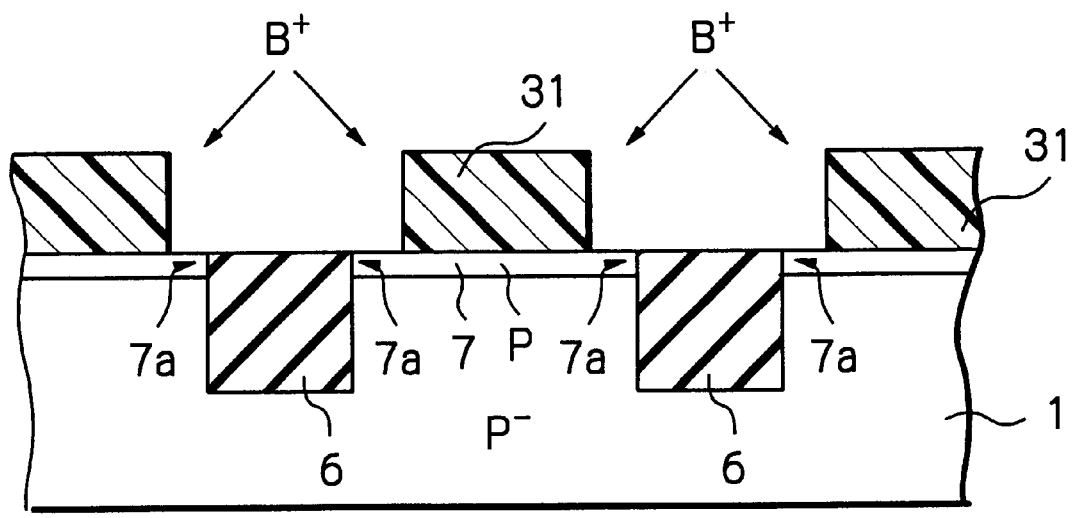

In FIGS. 14A and 14B, which illustrate a third modification of the second embodiment of the present invention, instead of implanting boron ions after the formation of the gate insulating layer 8 and the gate electrode layer 9 at a step as illustrated in FIGS. 10G and 11B, about $2 \times 10^{14}$ boron ions/cm$^2$ are implanted at an energy of about 30 keV and at an incident angle such as 30° to 45° into the silicon substrate 1 by using the photoresist pattern 31 as a mask before the formation of the gate insulating layer 8 and the gate electrode layer 9.

The first and second embodiments can be applied to a P-channel MOS transistor, which will be explained next.

A third embodiment of the method for manufacturing a semiconductor device such as a P-channel MOS transistor will now be explained with reference to FIGS. 15A through 15K.

Figure 15A:
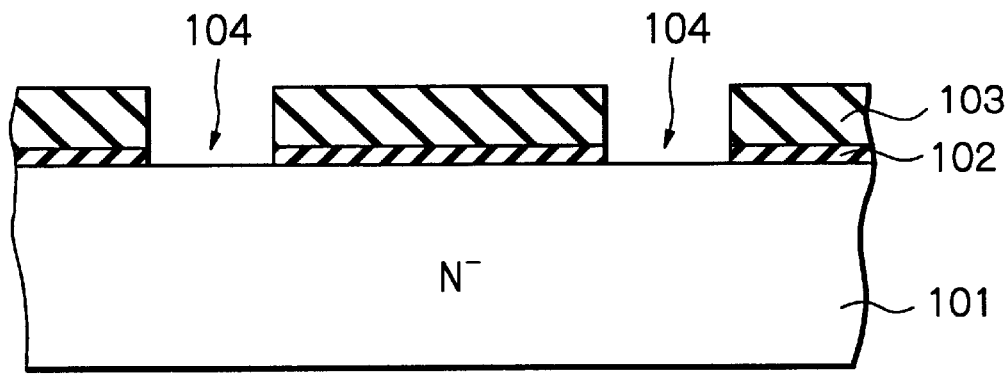
FIGS. 15A through 15K are cross-sectional views illustrating a third embodiment of the method for manufacturing a semiconductor device according to the present invention.

First, referring to FIG. 15A, in a similar way to those of FIG. 4A, a silicon oxide layer 102 and a silicon nitride layer 103 are deposited on an N$^-$-type monocrystalline silicon substrate 101. In this case, the silicon oxide layer 102 can be formed by thermally oxidizing the silicon substrate 101. Also, the silicon substrate 101 can be replaced by an N$^-$-type epitaxial silicon layer grown on a P$^-$-type monocrystalline silicon substrate. Then, an opening 104 is perforated in the silicon nitride layer 103 and the silicon oxide layer 102 by a photolithography and etching process.

Figure 15B:
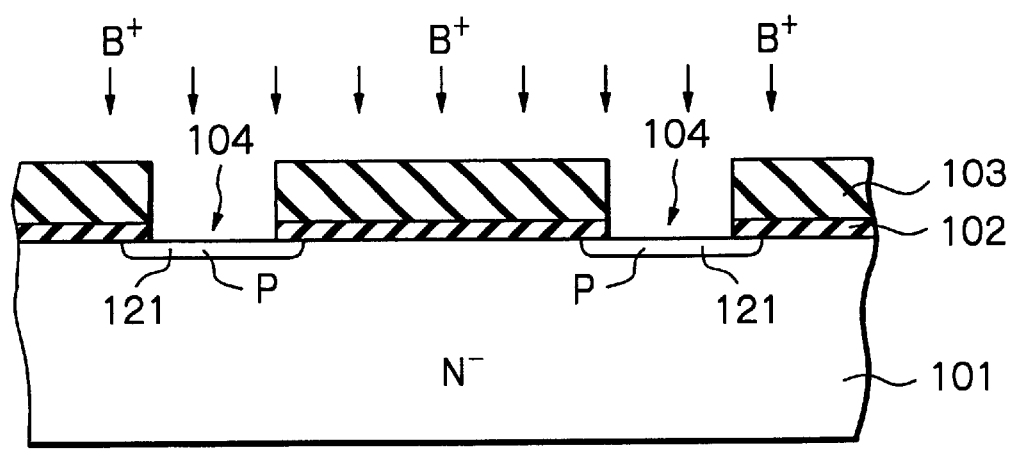

Next, referring to FIG. 15B, in the same way as in FIG. 4B, about $2 \times 10^{14}$ boron ions/cm$^2$ are implanted at an energy of about 10 keV and at a normal angle into the silicon substrate 101 by using the silicon nitride layer 103 and the silicon oxide layer 102 as a mask. As a result, a P-type impurity diffusion region 121 is formed at the bottom of the opening 104 and beneath the silicon oxide layer 102. That is, since boron ions have a large diffusion coefficient for the silicon substrate 101, boron ions are easily diffused into the silicon substrate 101 along the horizontal and vertical directions.

Figure 15C:
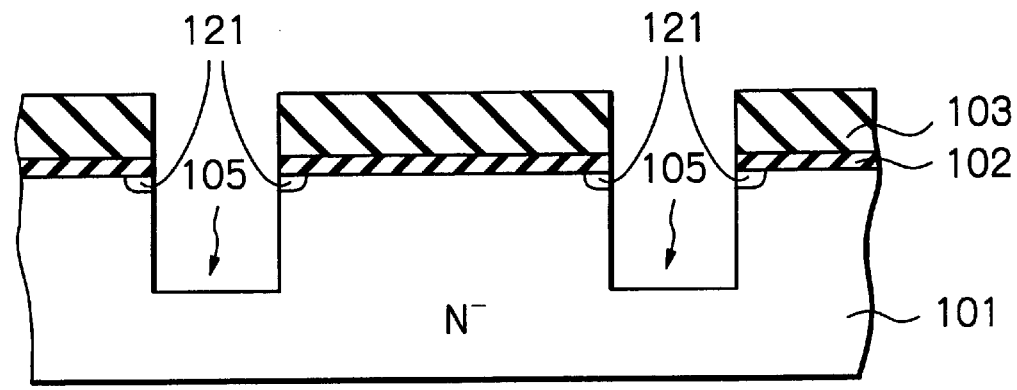

Next, referring to FIG. 15C, in the same way as in FIG. 4C, the silicon substrate 101 is etched by using the silicon nitride layer 103 and the silicon oxide layer 102 as a mask. As a result, a trench (groove) 105 is formed within the silicon substrate 101.

Figure 15D:
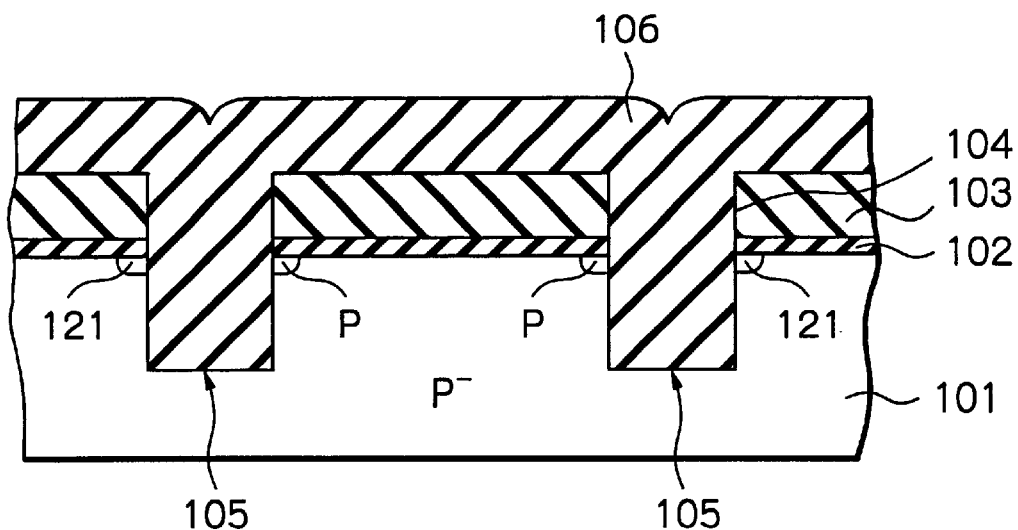

Next, referring to FIG. 15D, in the same way as in FIG. 4D, a silicon oxide layer 106 is buried in the trench 105 of the silicon substrate 101 and opening 104 of the silicon nitride layer 103 and the silicon oxide layer 102 by a thermal oxidation process and a CVD process.

Figure 15E:
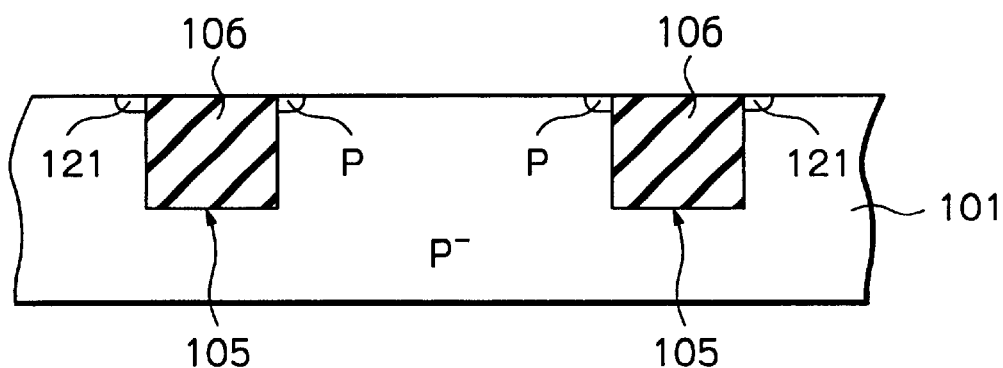

Next, referring to FIG. 15E, in the same way as in FIG. 4E, the silicon oxide layer 106, the silicon nitride layer 103 and the silicon oxide layer 102 are flattened by a CMP process. As a result, the silicon oxide layer 106 is left only within the trench 105. Thus, the silicon oxide layer 106 buried in the trench 105 serves as an STI layer, to partition element forming areas from each other.

Figure 15F:
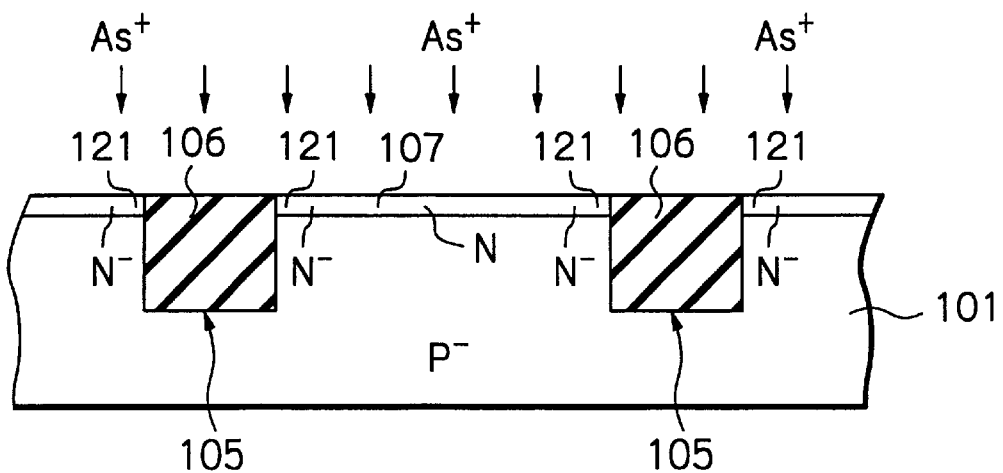

Next, referring to FIG. 15F, in a similar way to those of FIG. 4F, about $8 \times 10^{12}$ arsenic or phosphorus ions/cm$^2$ are implanted at an energy of about 50 keV into the silicon substrate 101 to form an N-type impurity diffusion region 107 within the silicon substrate 101. Note that the N-type impurity diffusion region 107 including the P-type impurity diffusion region 121 is used for adjusting the threshold voltage of a P-channel MOS transistor which will be formed.

Figure 15G:
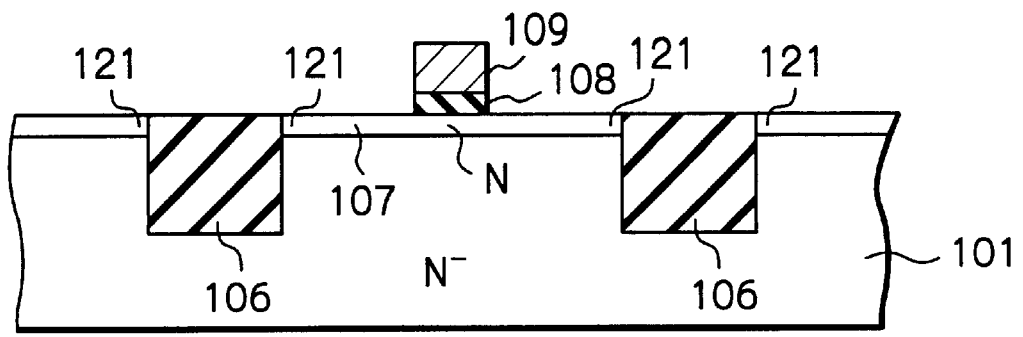

Next, referring to FIG. 15G, in the same way as in FIG. 4G, after the surface of the device is cleaned and rinsed, a silicon oxide layer is formed by thermally oxidizing the semiconductor substrate 101, and a polycrystalline silicon layer is deposited on the silicon oxide layer by a CVD process. Then, the polycrystalline silicon layer and the silicon oxide layer are patterned by a photolithography and etching process, so that a gate insulating layer 108 and a gate electrode layer 109 are formed.

Figure 15H:
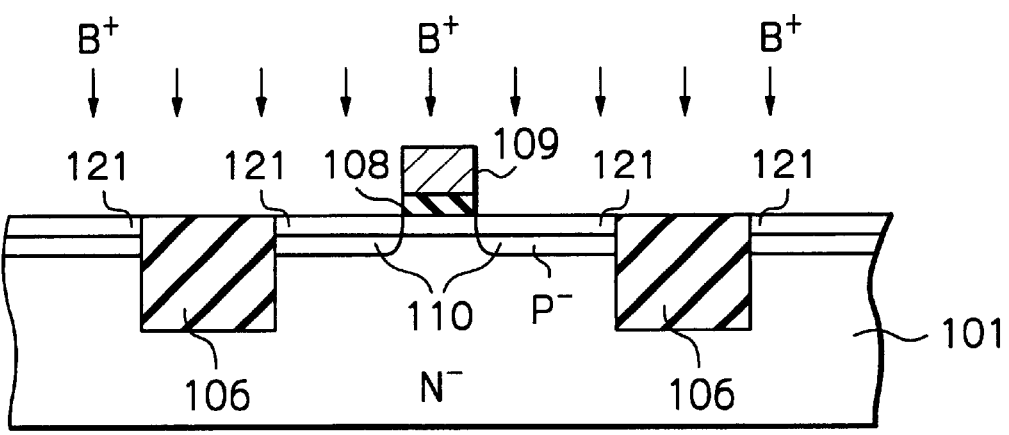

Next, referring to FIG. 15H, in a similar way to those of FIG. 4H, about $3 \times 10^{14}$ boron ions/cm$^2$ are implanted at an energy of about 30 keV into the silicon substrate 101 by using the gate electrode layer 109 and the gate insulating layer 108 as a mask. As a result, a P$^-$-type impurity region 110 for an LDD structure is formed within the silicon substrate 101.

Figure 15I:
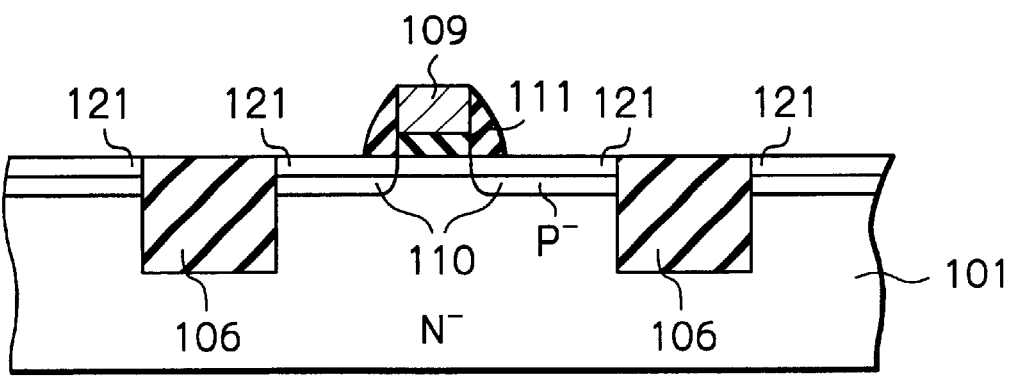

Next, referring to FIG. 15I, in the same way as in FIG. 4I, a silicon oxide layer is deposited on the entire surface by a CVD process, and the silicon oxide layer is etched back by an anisotropic etching process. As a result, a sidewall insulating layer 111 is formed on the sidewalls of the gate insulating layer 108 and the gate electrode layer 109.

Figure 15J:
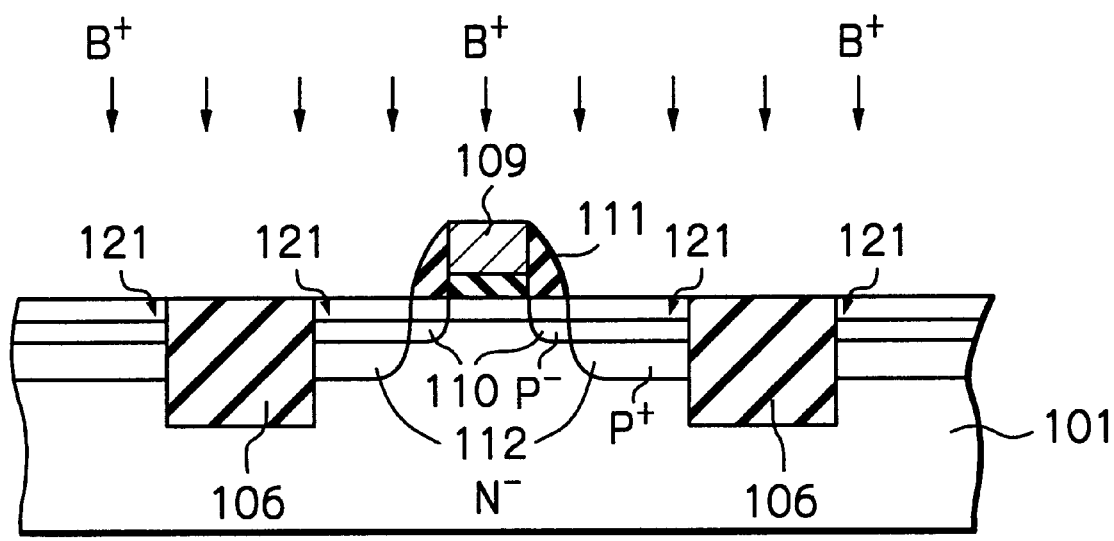

Next, referring to FIG. 15J, in a similar way to those of FIG. 4J, about $3 \times 10^{15}$ boron ions/cm$^2$ are again implanted at an energy of about 30 keV into the silicon substrate 101 by using the gate electrode layer 109, the gate insulating layer 108 and the sidewall insulating layer 111 as a mask. As a result, a P$^+$-type impurity region 112 for the LDD structure is formed within the silicon substrate 101.

Figure 15K:
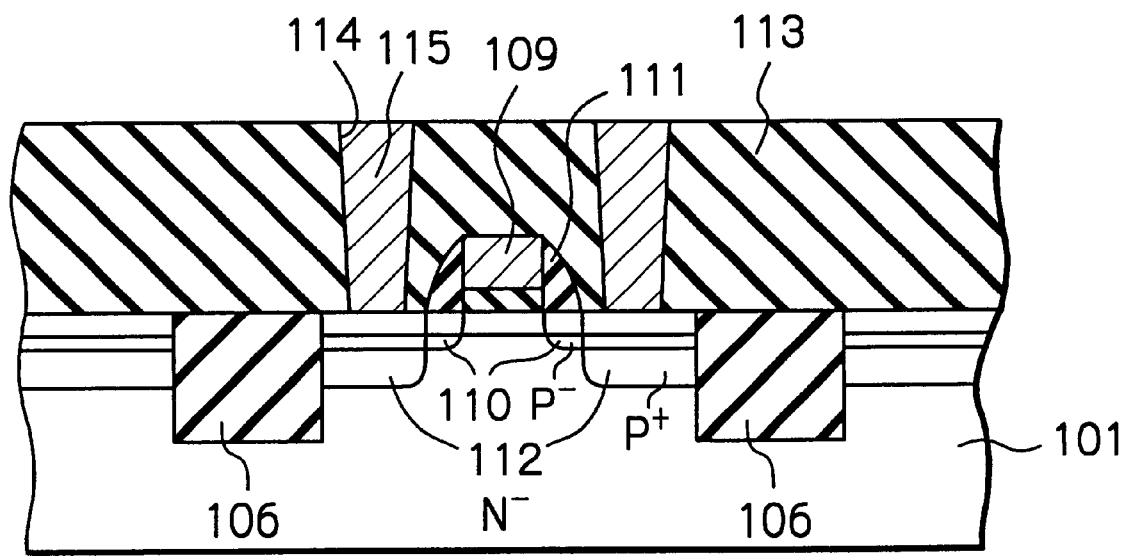

Finally, referring to FIG. 15K, in the same way as in FIG. 4K, an insulating layer 113 made of PSG or BPSG is formed on the entire surface. Then, contact holes 114 are perforated in the insulating layer 113, and contact plugs 15 made of polycrystalline silicon or the like are buried in the contact holes 114. In this case, a contact plug (not shown) is formed for the gate electrode layer 109. Then, wiring layers are formed on the contact plugs to complete the P-channel MOS transistor.

In the third embodiment, since solid solubility of arsenic or phosphorus is smaller in silicon oxide than in silicon, after the N-type impurity diffusion region 107 including the P-type impurity diffusion region 121 is subjected to a heating or annealing process, arsenic or phosphorus atoms are moved by such a heating or annealing process from the silicon oxide (STI) layer 106 to the silicon substrate 101. In this case, however, even if arsenic or phosphorus atoms are segregated by the silicon oxide (STI) layer 106, since the concentration of arsenic or phosphorus atoms at the ends of the channel in the width direction is depleted by the P-type impurity diffusion region 121, the concentration of arsenic or phosphorus atoms at the ends of the channel in the width direction is substantially made equal to that at the center thereof. This does not decrease the threshold voltage of the P-channel MOS transistor, thus suppressing the narrow channel width effect.

In the third embodiment, note that the first and second modifications as illustrated in FIGS. 8 and 9 can be applied thereto.

A fourth embodiment of the method for manufacturing a semiconductor device such as a P-channel MOS transistor will be explained next with reference to FIGS. 16A through 16G.

Figure 16A:
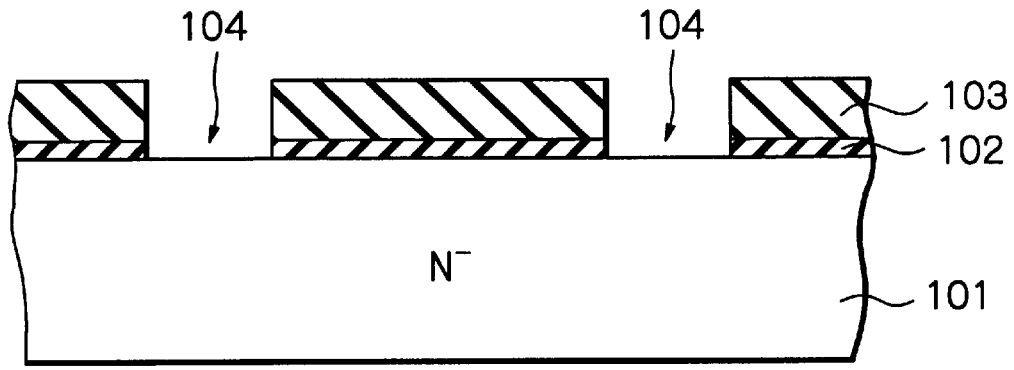
FIGS. 16A through 16G are cross-sectional views illustrating a fourth embodiment of the method for manufacturing a semiconductor device according to the present invention.

First, referring to FIG. 16A, in the same way as in FIG. 10A, a silicon oxide layer 102 and a silicon nitride layer 103 are deposited on an N$^-$-type monocrystalline silicon substrate 101. In this case, the silicon oxide layer 102 can be formed by thermally oxidizing the silicon substrate 101. Also, the silicon substrate 101 can be replaced by an N$^-$-type epitaxial silicon layer grown on a P$^-$-type monocrystalline silicon substrate. Then, an opening 104 is perforated in the silicon nitride layer 103 and the silicon oxide layer 102 by a photolithography and etching process.

Figure 16B:
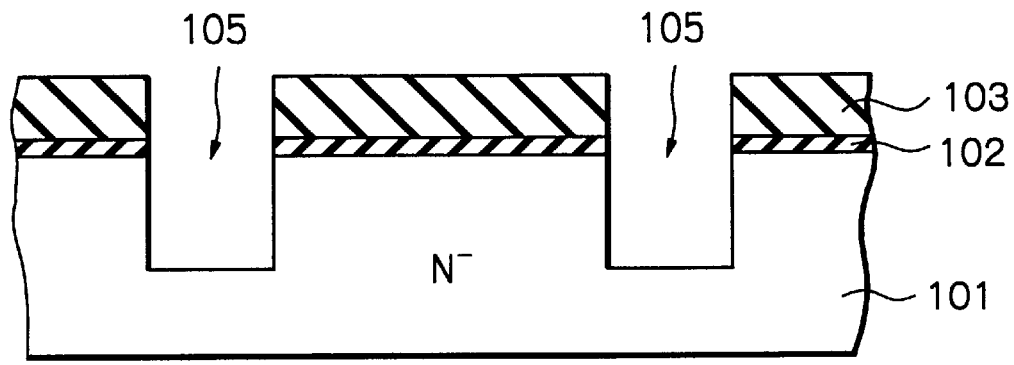

Next, referring to FIG. 16B, in the same way as in FIG. 10B, the silicon substrate 101 is etched by using the silicon nitride layer 103 and the silicon oxide layer 102 as a mask. As a result, a trench (groove) 105 is formed within the silicon substrate 101.

Figure 16C:
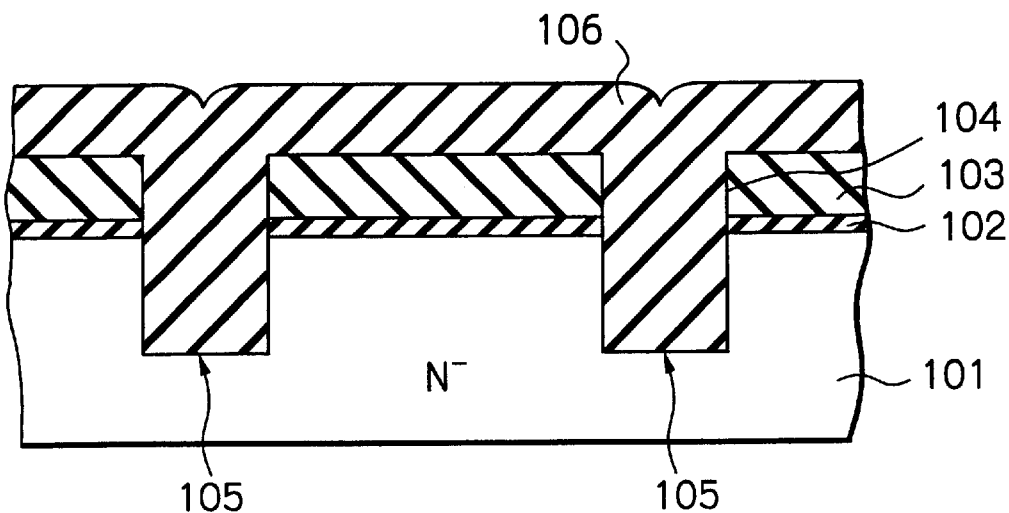

Next, referring to FIG. 16C, in the same way as in FIG. 10C, a silicon oxide layer 106 is buried in the trench 105 of the silicon substrate 101 and opening 104 of the silicon nitride layer 103 and the silicon oxide layer 102 by a thermal oxidation process and a CVD process.

Figure 16D:
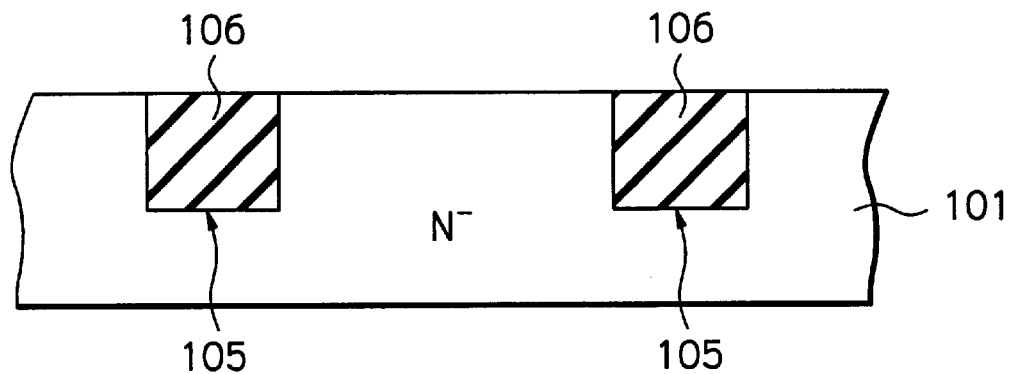

Next, referring to FIG. 16D, in the same way as in FIG. 10D, the silicon oxide layer 106, the silicon nitride layer 103 and the silicon oxide layer 102 are flattened by a CMP process. As a result, the silicon oxide layer 106 is left only within the trench 105. Thus, the silicon oxide layer 106 buried in the trench 105 serves as an STI layer, to partition element forming areas from each other.

Figure 16E:
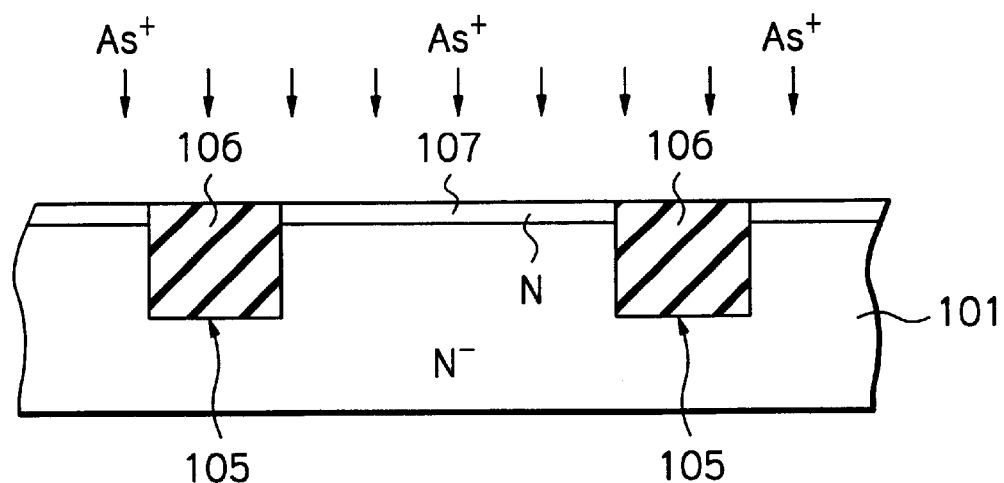

Next, referring to FIG. 16E, in a similar way to those of FIG. 10E, about $8 \times 10^{12}$ arsenic or phosphorus ions/cm$^2$ are implanted at an energy of about 50 keV into the silicon substrate 101 to form an N-type impurity diffusion region 107 within the silicon substrate 101. Note that the N-type impurity diffusion region 107 is used for adjusting the threshold voltage of a P-channel MOS transistor which will be formed.

Figure 16F:
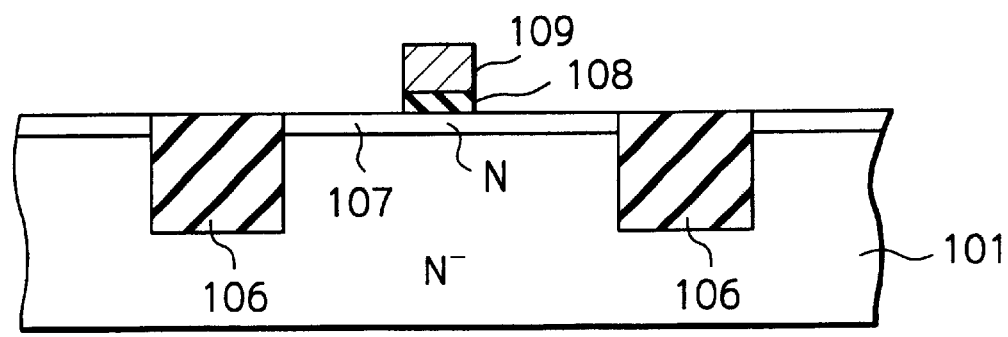

Next, referring to FIG. 16F, in the same way as in FIG. 10F, after the surface of the device is cleaned and rinsed, a silicon oxide layer is formed by thermally oxidizing the semiconductor substrate 101, and a polycrystalline silicon layer is deposited on the silicon oxide layer by a CVD process. Then, the polycrystalline silicon layer and the silicon oxide layer are patterned by a photolithography and etching process, so that a gate insulating layer 108 and a gate electrode layer 109 are formed.

Figure 16G:
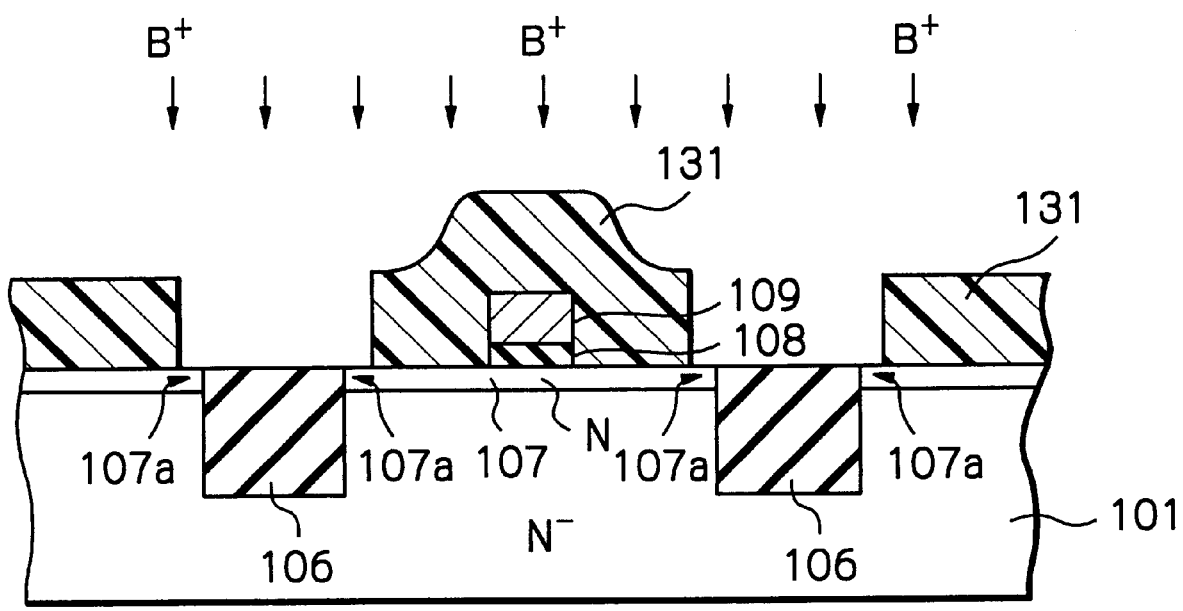

Next, referring to FIG. 16G, in the same way as in FIG. 10G, a photoresist pattern 131 is formed by a photolithography process. That is, the photoresist pattern 131 is perforated to expose the STI layer 106, and therefore, the photoresist pattern 131 can be formed by using the same photomask used for forming the opening 104. In this case, the irradiation amount or the resist material is adjusted, so that the edge of the photoresist pattern 131 can be made to recede from the edge of the STI layer 106.

Then, about $2 \times 10^{14}$ boron ions/cm$^2$ are implanted at an energy of about 30 keV and at a normal angle into the silicon substrate 101 by using the photoresist pattern 131 as a mask. In this case, since the implanted boron ions need to penetrate the gate electrode layer 109 and the gate insulating layer 108, the energy of the implanted boron ions is larger than that in the third embodiment as illustrated in FIG. 15B. As a result, the concentration of arsenic or phosphorus ions of the N-type impurity diffusion region 107 at the periphery area 107a of the STI layer 106 is depleted.

Thereafter, in the same way as in FIG. 15H, a P⁻-type impurity region 110 for an LDD structure is formed within the silicon substrate 101. Then, in the same way as in FIG. 15I, a sidewall insulating layer 111 is formed on the sidewalls of the gate insulating layer 108 and the gate electrode layer 109. Then, in the same way as in FIG. 15J, a P⁺-type impurity region 112 for the LDD structure is formed within the silicon substrate 101. Then, in the same way as in FIG. 15K, an insulating layer 113 made of PSG or BPSG is formed on the entire surface. Then, contact holes 114 are perforated in the insulating layer 113, and contact plugs 115 made of polycrystalline silicon or the like are buried in the contact holes 114. Finally, wiring layers are formed on the contact plugs 115 to complete the P-channel MOS transistor.

Even in the fourth embodiment, even if arsenic or phosphorus atoms are segregated by the silicon oxide (STI) layer 106, since the concentration of arsenic or phosphorus atoms at the ends 107a of a channel in the width direction is depleted, the concentration of arsenic or phosphorus atoms at the ends of the channel in the width direction is substantially made equal to that at the center thereof. This does not decrease the threshold voltage of the P-channel MOS transistor, thus suppressing the narrow channel width effect.

In the fourth embodiment, note that the first, second and third modifications as illustrated in FIGS. 12A, 12B, 13A, 13B, 14A and 14B can be applied thereto.

When one of the first and second embodiments for an N-channel MOS transistor is combined with one of the third and fourth embodiments for a P-channel MOS transistor, a CMOS device can be easily manufactured, which will be explained next.

A fifth embodiment of the method for manufacturing a semiconductor device such as a CMOS device will now be explained with reference to FIGS. 17A through 17J.

Figure 17A:
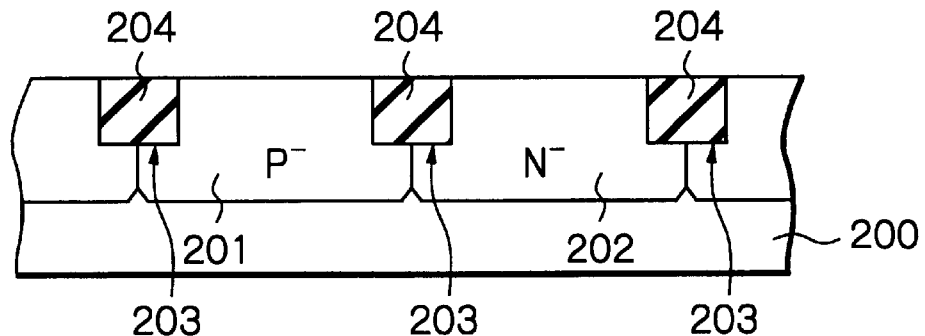
FIGS. 17A through 17J are cross-sectional views illustrating a fifth embodiment of the method for manufacturing a semiconductor device according to the present invention.

First, referring to FIG. 17A, a P⁻-type well 201 and an N⁻-type well 202 are formed on a P⁻-type monocrystalline silicon substrate 200. Then, in the same way as in the second and fourth embodiments, trenches 203 are formed, and a silicon oxide (STI) layer 204 is buried in the trenches 203 to partition an N-channel MOS transistor area and a P-channel MOS transistor area.

Figure 17B:
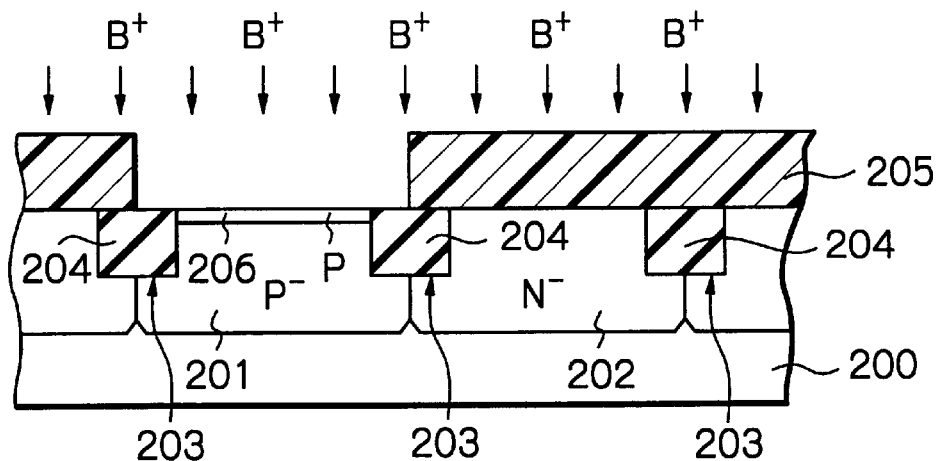

Next, referring to FIG. 17B, a photoresist pattern 205 is formed to cover an area other the N-channel MOS transistor area, and then, boron ions are implanted into the P-type well 201 by using the photoresist pattern 205 as a mask to form a P-type impurity diffusion region 206 for adjusting the threshold voltage of an N-channel MOS transistor. Then, the photoresist pattern 205 is removed.

Figure 17C:
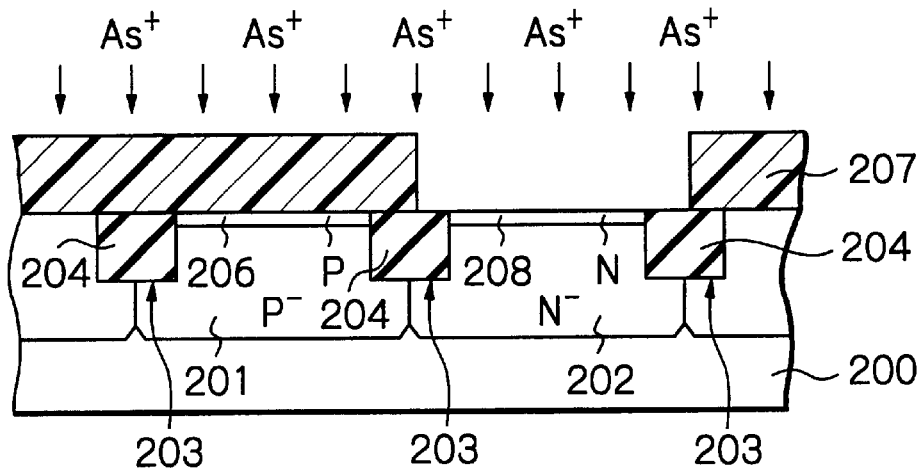

Next, referring to FIG. 17C, a photoresist pattern 207 is formed to cover an area other the P-channel MOS transistor area, and then, arsenic or phosphorus ions are implanted into the N-type well 202 by using the photoresist pattern 207 as a mask to form an N-type impurity diffusion region 208 for adjusting the threshold voltage of a P-channel MOS transistor. Then, the photoresist pattern 207 is removed.

Figure 17D:
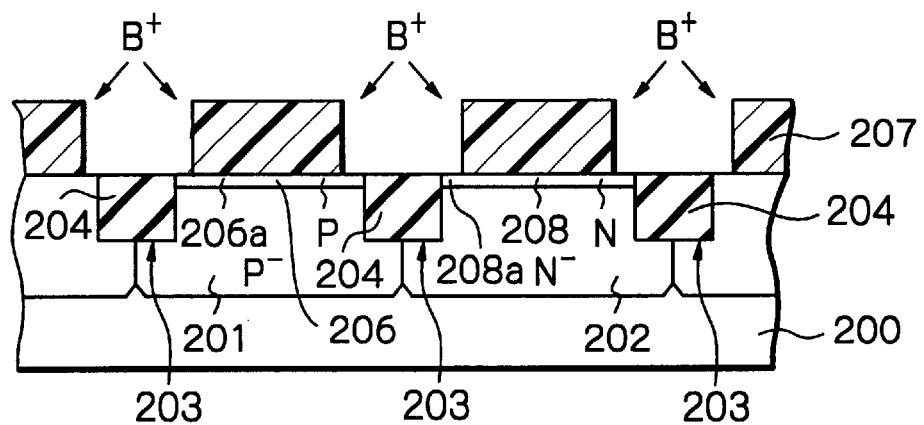

Next, referring to FIG. 17D, a photoresist pattern 209 is formed, and then, about $2 \times 10^{14}$ boron ions/cm² are implanted at an energy of about 10 keV and at an incident angle such as 30° to 45° by using the photoresist pattern 209 as a mask. As a result, the boron concentration of the P-type impurity diffusion region 206 is enhanced at its ends 206a, while the arsenic or phosphorus concentration of the N-type impurity diffusion region 208 is depleted at its ends 208a. Then, the photoresist pattern 209 is removed.

Figure 17E:
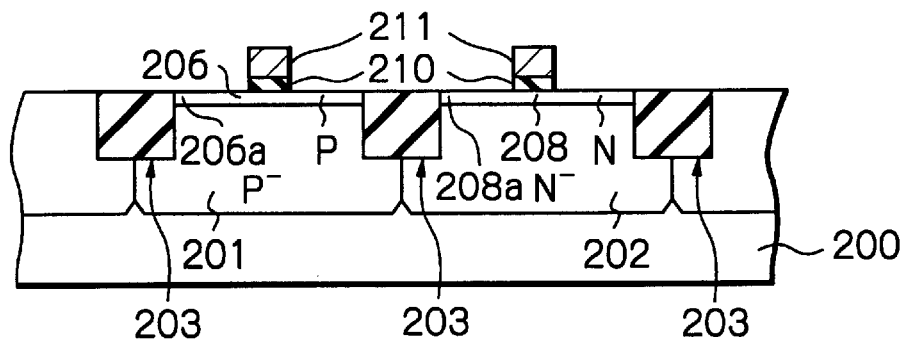

Next, referring to FIG. 17E, after the surface of the device is cleaned and rinsed, a silicon oxide layer is formed by thermally oxidizing the P⁻-type well 201 and the N⁻-type well 202, and a polycrystalline silicon layer is deposited on the silicon oxide layer by a CVD process. Then, the polycrystalline silicon layer and the silicon oxide layer are patterned by a photolithography and etching process, so that a gate insulating layer 210 and a gate electrode layer 211 are formed.

Figure 17F:
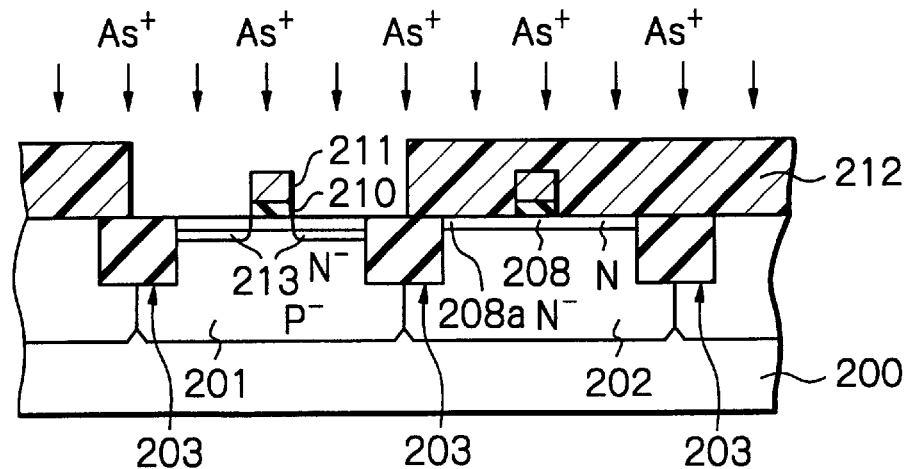

Next, referring to FIG. 17F, a photoresist pattern 212 is formed, and then about $3 \times 10^{14}$ arsenic ions/cm² are implanted at an energy of about 30 keV into the P⁻-type well 201 by using the gate electrode 211, the gate insulating layer 210 and the photoresist pattern 212 as a mask. As a result, an N⁻-type impurity region 213 for an LDD structure is formed within the P⁻-type well 201. Then, the photoresist pattern 212 is removed.

Figure 17G:
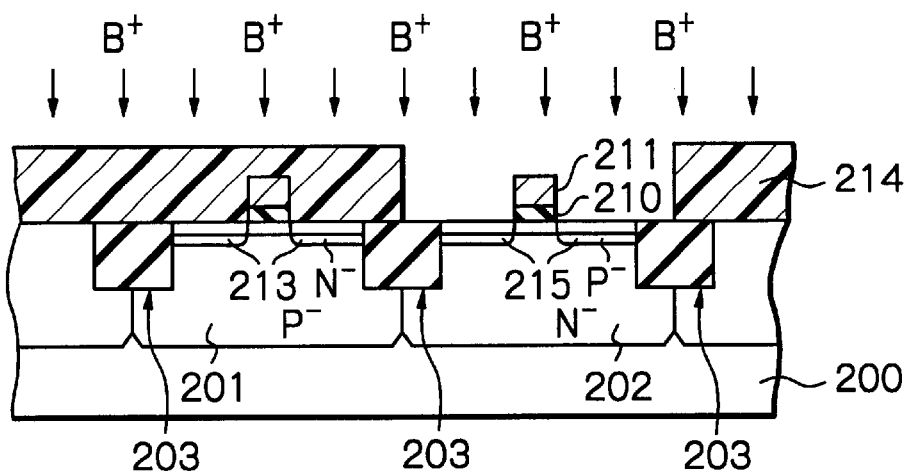

Next, referring to FIG. 17G, a photoresist pattern 214 is formed, and then about $3 \times 10^{14}$ boron ions/cm² are implanted at an energy of about 30 keV into the N⁻-type well 202 by using the gate electrode layer 211, the gate insulating layer 210 and the photoresist pattern 214 as a mask. As a result, a P⁻-type impurity region 215 for an LDD structure is formed within the N⁻-type well 202. Then, the photoresist pattern 214 is removed.

Figure 17H:
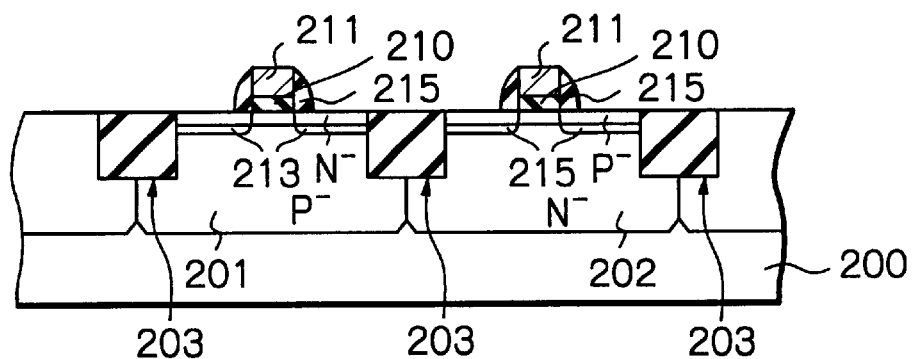

Next, referring to FIG. 17H, a silicon oxide layer is deposited on the entire surface by a CVD process, and the silicon oxide layer is etched back by an anisotropic etching process. As a result, a sidewall insulating layer 216 is formed on the sidewalls of the gate insulating layer 210 and the gate electrode layer 211.

Figure 17I:
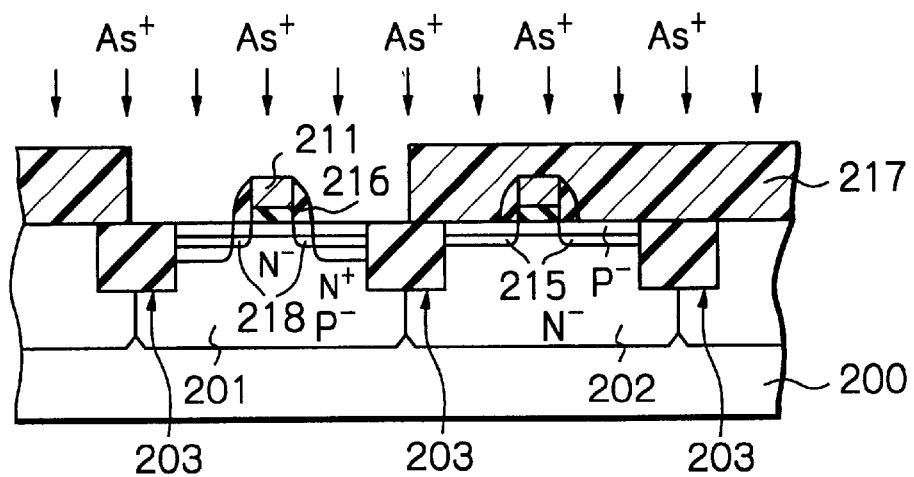

Next, referring to FIG. 17I, a photoresist pattern 217 is formed, and then, about $3 \times 10^{15}$ arsenic ions/cm² are again implanted at an energy of about 30 keV into the silicon substrate 1 by using the gate electrode layer 211, the gate insulating layer 210, the sidewall insulating layer 216 and the photoresist pattern 217 as a mask. As a result, an N⁺-type impurity region 218 for the LDD structure is formed within the P⁻-type well 201. Then, the photoresist pattern 217 is removed.

Figure 17J:
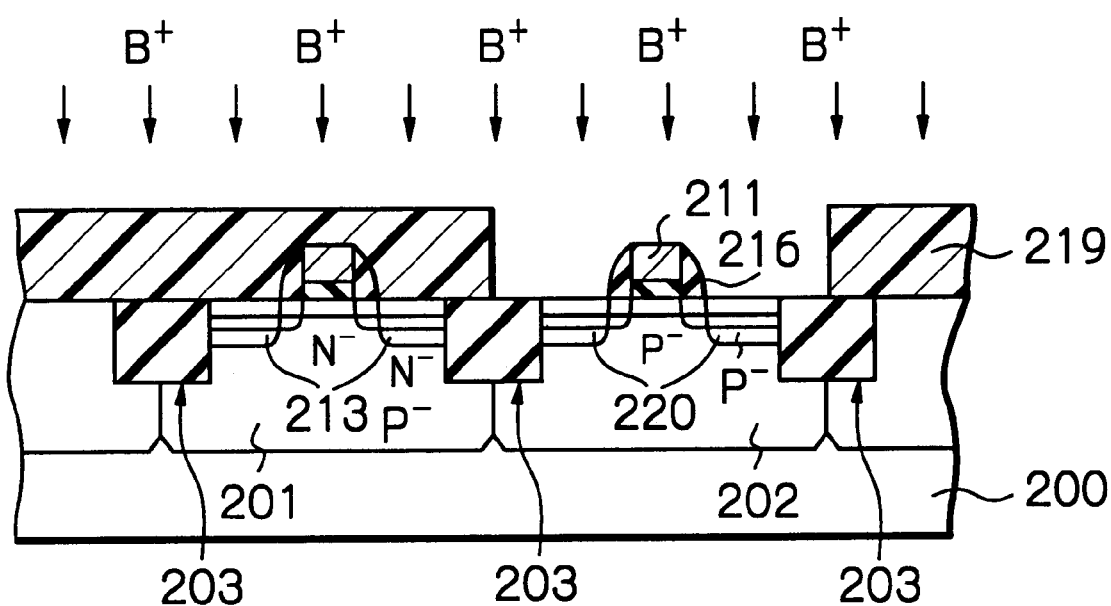

Finally, referring to FIG. 17J, a photoresist pattern 218 is formed, and then, about $3 \times 10^{15}$ boron ions/cm² are again implanted at an energy of about 30 keV into the silicon substrate 1 by using the gate electrode layer 211, the gate insulating layer 210, the sidewall insulating layer 216 and the photoresist pattern 218 as a mask. As a result, a P⁺-type impurity region 220 for the LDD structure is formed within the N⁻-type well 202. Then, the photoresist pattern 219 is removed.

Thereafter, an insulating layer (not shown) made of PSG or BPSG is formed on the entire surface. Then, contact holes are perforated in the insulating layer, and contact plugs made of polycrystalline silicon or the like are buried in the contact holes. Then, wiring layers are formed on the contact plugs to complete the CMOS device.

In the fifth embodiment, since the boron implantation is carried out simultaneously for the ends of the channels of the N-channel MOS transistor and P-channel MOS transistor, the manufacturing cost can be decreased.

Figure 18A:
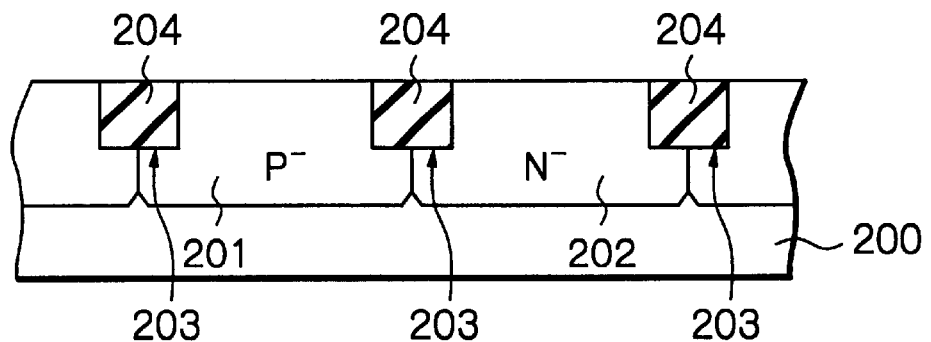
FIGS. 18A through 18I are cross-sectional views illustrating a sixth embodiment of the method for manufacturing a semiconductor device according to the present invention.
Figure 18B:
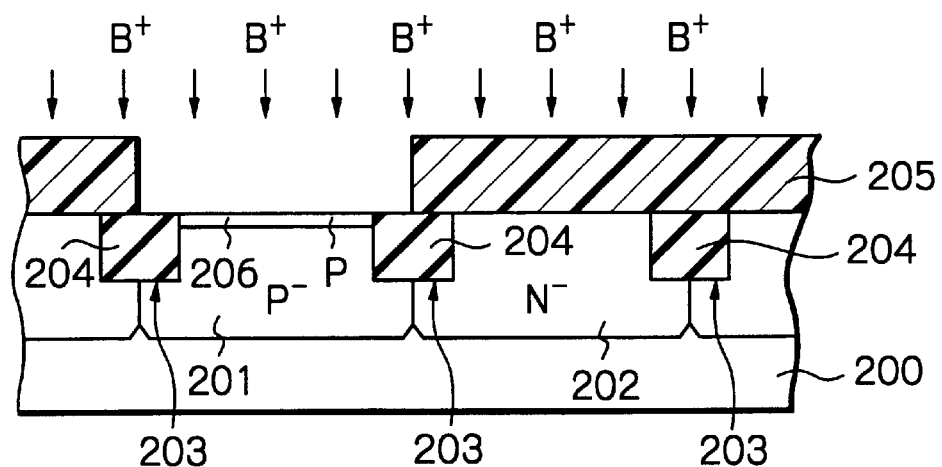
Figure 18C:
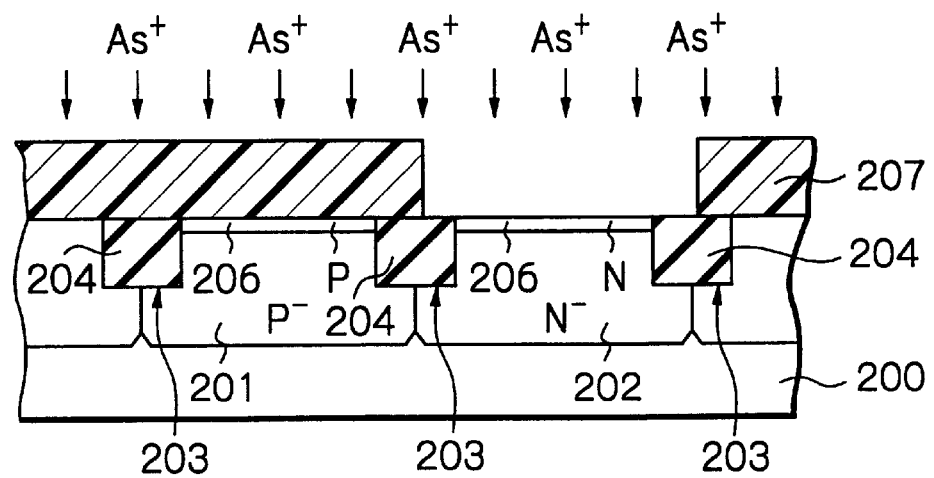
Figure 18D:
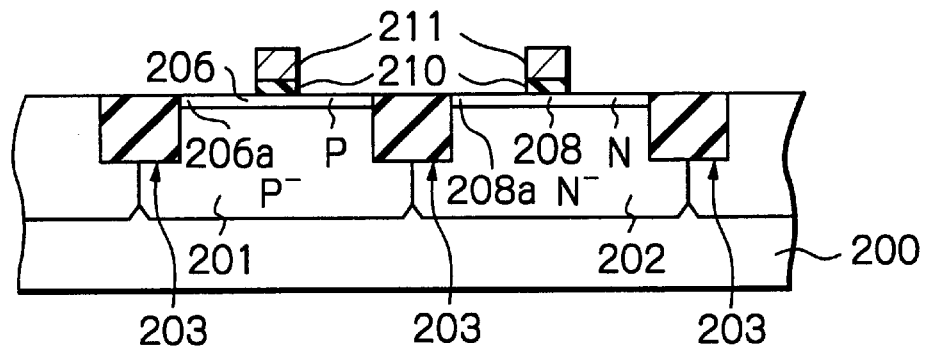
Figure 18E:
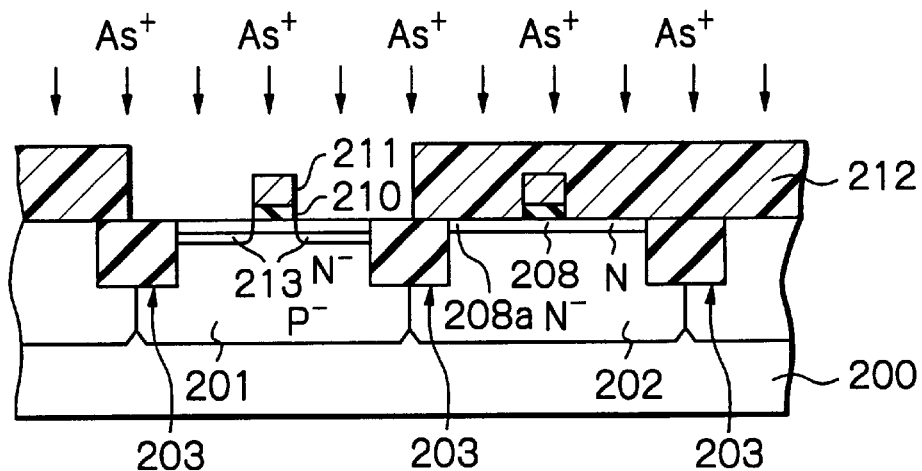
Figure 18F:
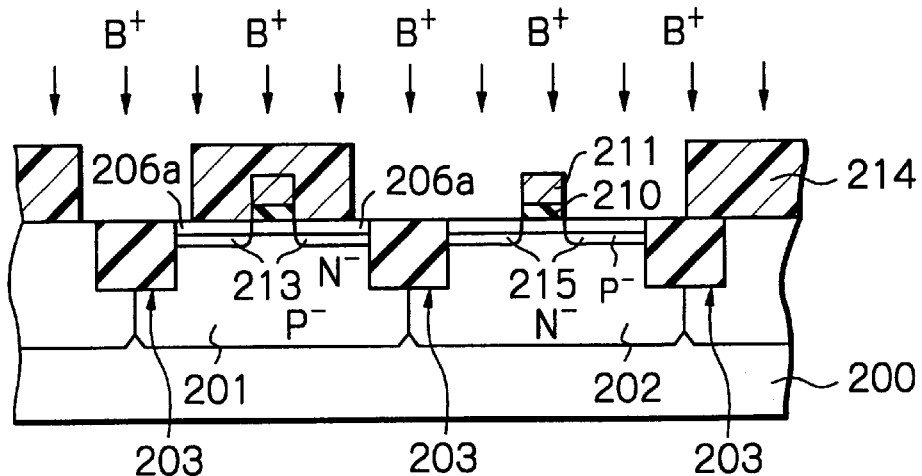
Figure 18G:
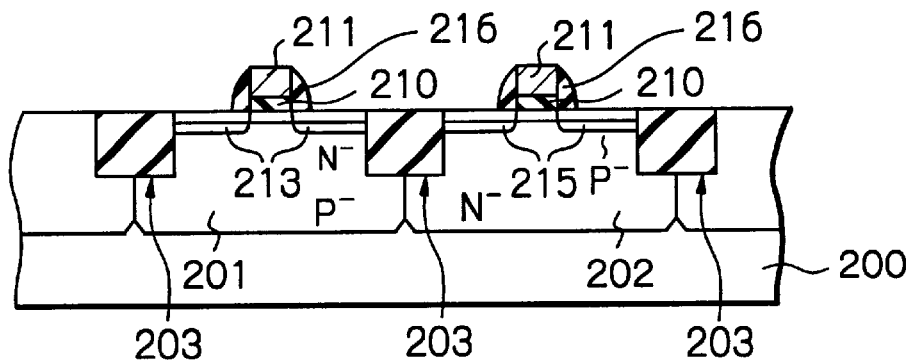
Figure 18H:
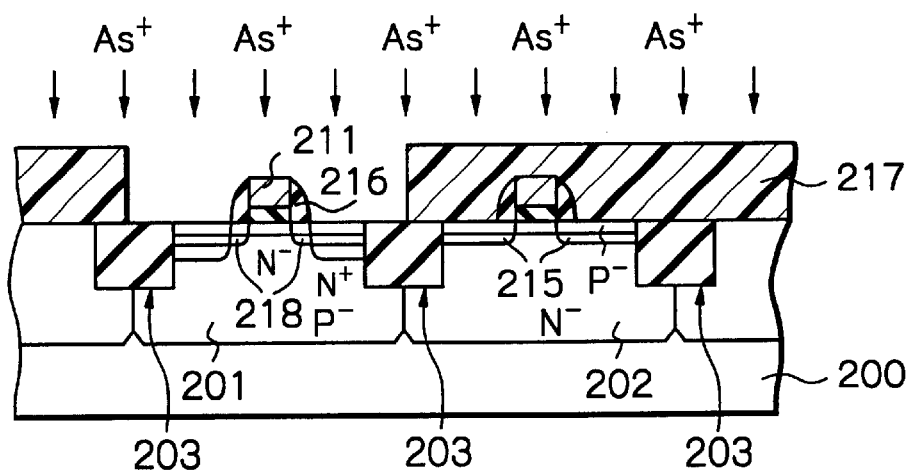
Figure 18I:
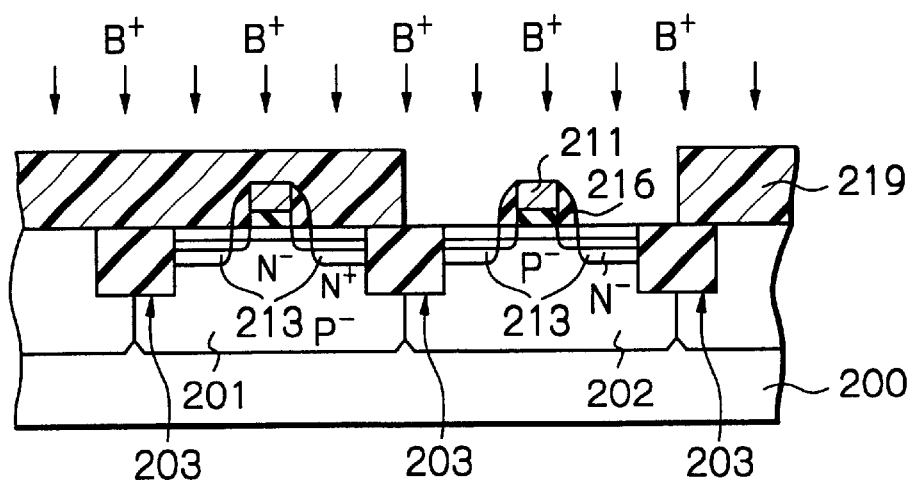

FIGS. 18A through 18I, which illustrate a sixth embodiment of the present invention, correspond to FIGS. 17A, 17B, 17C and 17E through 17J, respectively. In the sixth embodiment, the enhancement of boron concentration is carried out for the ends of a channel of the N-channel MOS transistor, while the enhancement of boron concentration is not carried out for the ends of a channel of the P-channel MOS transistor. Therefore, the step as illustrated in FIG. 17D is omitted. Instead of this, at a step as illustrated in FIG. 18F which corresponds to FIG. 17G, boron ions are implanted into the N⁻-type well 202 for forming the P⁻-type impurity diffusion region 215 for an LDD structure, and simultaneously, boron ions are implanted into the P⁻-type well 201 for enhancing the boron concentration of the ends 206a of the P-type impurity diffusion region 206.

In the sixth embodiment, since the boron implantation is carried out simultaneously for the ends of the channel of the N-channel MOS transistor and the P-type impurity diffusion region of the LDD structure of the P-channel MOS transistor, the manufacturing cost can also be decreased.

As explained hereinabove, according to the present invention, since impurities are implanted into the ends of a channel in the channel width direction to compensate for the segregation of impurities by a shallow trench isolation layer made of silicon oxide, the narrow channel width effect can be suppressed.

What is claimed is:

1. A method for manufacturing a semiconductor device, comprising the steps of:
    forming a shallow trench isolation layer made of silicon oxide in a semiconductor substrate to partition an area for forming a plurality of MOS transistors of at least one of P or N type, said area having edge portions of a selected width adjacent to said shallow trench isolation layer, and substantially surrounding each individual one of said plurality of MOS transistors;
    introducing first impurities into substantially all of said MOS transistor forming area to adjust a threshold voltage of said MOS transistors after said shallow trench isolation layer is formed;
    introducing second impurities into said edge portions of said MOS transistor forming area of said semiconductor substrate to adjust a threshold voltage of said edge portions of said MOS transistors and;
    performing a heating process upon said semiconductor substrate so that a concentration of said impurities in said MOS transistor area of said semiconductor substrate is substantially uniform, after said first and second impurities are introduced.

2. The method as set forth in claim 1, wherein said first and second impurities are both boron atoms.

3. The method as set forth in claim 1, wherein said first impurities are arsenic atoms and said second impurities are boron atoms.

4. The method as set forth in claim 1, wherein said first impurities are phosphorus atoms and said second impurities are boron atoms.

5. The method as set forth in claim 1, wherein said second impurities are introduced before said shallow trench isolation layer is formed.

6. The method as set forth in claim 1, wherein said second impurities are introduced after said shallow trench layer is formed and before said first impurities are introduced.

7. The method as set forth in claim 1, further comprising the steps of:
    forming a gate insulating layer on said MOS transistor forming area after said first impurities are introduced; and
    forming a gate electrode on said gate insulating layer, said second impurities being introduced after said gate electrode is formed.

8. The method as set forth in claim 1, further comprising the steps of:
    forming a gate insulating layer on said MOS transistor forming area after said first impurities are introduced; and
    forming a gate electrode on said gate insulating layer, said second impurities being introduced after said first impurities are introduced and before said gate insulating layer is formed.

9. The method as set forth in claim 1, wherein said second impurities are introduced by implanting said second impurities approximately perpendicularly incident to said semiconductor substrate.

10. The method as set forth in claim 1, wherein said second impurities are introduced by implanting said second impurities obliquely incident to said semiconductor substrate while said semiconductor substrate is rotating.

11. A method for manufacturing a semiconductor device, comprising the steps of:
    forming a patterned insulating layer having at least an area selected for forming a plurality of MOS transistor of at least one of P or N type on a semiconductor substrate, said patterned area having at least a first width;
    introducing first impurities into portions of said semiconductor substrate not selected for forming MOS transistors by using said patterned insulating layer as a mask and diffusing said first impurities for a selected distance into said portion selected for forming MOS transistors;
    forming a trench in said semiconductor substrate by etching said semiconductor substrate using said insulating layer as a mask after said first impurities are introduced, wherein said etching changes said first width by an amount that is less than said selected distance;
    burying a shallow trench isolation layer made of silicon oxide in said trench;
    introducing second impurities into said area selected for forming said MOS transistors in said semiconductor substrate to adjust a threshold voltage of said MOS transistors after said shallow trench isolation layer is buried;
    forming a gate insulating layer on said MOS forming area of said semiconductor substrate after said second impurities are introduced;
    forming a gate electrode on said gate insulating layer; and
    performing a heating process upon said semiconductor substrate so that a concentration of said second impurities in said MOS transistor area of said semiconductor substrate is substantially uniform, after said gate electrode is formed.

12. The method as set forth in claim 11, wherein said MOS transistor is an N-channel MOS transistor, and said first and second impurities are both boron atoms.

13. The method as set forth in claim 11, wherein said MOS transistor is a P-channel MOS transistor, and said first impurities are boron atoms and said second impurities are arsenic atoms.

14. The method as set forth in claim 11, wherein said MOS transistor is a P-channel MOS transistor, and said first impurities are boron atoms and said second impurities are phosphorous atoms.

15. The method as set forth in claim 11, wherein said first impurities are introduced by implanting said first impurities approximately perpendicularly incident to said semiconductor substrate.

16. The method as set forth in claim 11, wherein said first impurities are introduced by implanting said first impurities obliquely incident to said semiconductor substrate while said semiconductor substrate is rotating.

17. A method for manufacturing a semiconductor device, comprising the steps of:
   forming a patterned insulating layer having a plurality of areas selected for forming a plurality of MOS transistors of at least one of P or N type on semiconductor substrate;
   forming a trench in said semiconductor substrate by etching said semiconductor substrate using said insulating layer as a mask;
   introducing first impurities into said semiconductor substrate within said trench by using said patterned insulating layer as a mask;
   burying a shallow trench isolation layer made of silicon oxide in said trench after said first impurities are introduced;
   introducing second impurities into said semiconductor substrate in said plurality of areas selected for forming said MOS transistors to adjust a threshold voltage of said MOS transistors after said shallow trench isolation layer is buried;
   forming a gate insulating layer on said MOS forming area of said semiconductor substrate after said second impurities are introduced;
   forming a gate electrode on said gate insulating layer; and
   performing a heating process upon said semiconductor substrate so that a concentration of said second impurities in said MOS transistor area of said semiconductor substrate is substantially uniform, after said gate electrode is formed.

18. The method as set forth in claim 17, wherein said MOS transistor is an N-channel MOS transistor, and said first and second impurities are both boron atoms.

19. The method as set forth in claim 17, wherein said MOS transistor is a P-channel MOS transistor, and said first impurities are boron atoms and said second impurities are arsenic atoms.

20. The method as set forth in claim 17, wherein said MOS transistor is a P-channel MOS transistor, and said first impurities are boron atoms and said second impurities are phosphorous atoms.

21. The method as set forth in claim 17, wherein said first impurities are introduced by implanting said first impurities approximately perpendicularly incident to said semiconductor substrate.

22. The method as set forth in claim 17, wherein said first impurities are introduced by implanting said first impurities obliquely incident to said semiconductor substrate while said semiconductor substrate is rotating.

23. A method for manufacturing a semiconductor device, comprising the steps of:
   forming a patterned insulating layer having an area for forming a plurality of MOS transistors of at least one of P or N type on a semiconductor substrate;
   forming a trench in said semiconductor substrate by etching said semiconductor substrate using said patterned insulating layer as a mask;
   burying a shallow trench isolation layer made of silicon oxide in said trench;
   introducing first impurities into said semiconductor substrate area for forming MOS transistors to adjust a threshold voltage of said MOS transistors after said shallow trench isolation layer is buried;
   forming a gate insulating layer on said MOS transistor forming area of said semiconductor substrate after said first impurities are introduced;
   forming a gate electrode on said gate insulating layer;
   introducing second impurities into edge portions of said MOS transistor forming area adjacent to said shallow trench isolation area of said semiconductor substrate to adjust a threshold voltage of said edge portions of said MOS transistors after said gate electrode is formed; and
   performing a heating process upon said semiconductor substrate so that a concentration of said first impurities in said MOS transistor area of said semiconductor substrate is substantially uniform, after said second impurities are introduced.

24. The method as set forth in claim 23, wherein said MOS transistor is an N-channel MOS transistor, and said first and second impurities are both boron atoms.

25. The method as set forth in claim 23, wherein said MOS transistor is a P-channel MOS transistor, and said first impurities are boron atoms and said second impurities are arsenic atoms.

26. The method as set forth in claim 23, wherein said MOS transistor is a P-channel MOS transistor, and said first impurities are boron atoms and said second impurities are phosphorus atoms.

27. The method as set forth in claim 23, wherein said second impurities are introduced by implanting said second impurities approximately perpendicularly incident to said semiconductor substrate.

28. The method as set forth in claim 23, wherein said second impurities are introduced by implanting said second impurities obliquely incident to said semiconductor substrate while said semiconductor substrate is rotating.

29. A method for manufacturing a semiconductor device, comprising the steps of:
   forming a patterned insulating layer having at least an area for forming a plurality of MOS transistors of at least one of P or N type on a semiconductor substrate;
   forming a trench in said semiconductor substrate by etching said semiconductor substrate using said patterned insulating layer as a mask;
   burying a shallow trench isolation layer made of silicon oxide in said trench;
   introducing first impurities into said semiconductor substrate to adjust a threshold voltage of said MOS transistors after said shallow trench isolation layer made of silicon oxide is buried;
   introducing second impurities into edge portions of said MOS transistor forming area adjacent to said shallow trench isolation layer of said semiconductor substrate to adjust a threshold voltage of edge portions of said MOS transistors after said first impurities are introduced;
   forming a gate insulating layer on said MOS forming area of said semiconductor substrate after said second impurities are introduced; and
   forming a gate electrode on said gate insulating layer; and
   performing a heating process upon said semiconductor substrate so that a concentration of said first impurities in said MOS transistor area of said semiconductor substrate is substantially uniform, after said gate electrode is formed.

30. The method as set forth in claim 29, wherein said MOS transistor is an N-channel MOS transistor, and said first and second impurities are both boron atoms.

31. The method as set forth in claim 29, wherein said MOS transistor is a P-channel MOS transistor, and said first impurities are boron atoms and said second impurities are arsenic atoms.

32. The method as set forth in claim 29, wherein said MOS transistor is a P-channel MOS transistor, and said first impurities are boron atoms and said second impurities are phosphorus atoms.

33. The method as set forth in claim 29, wherein said second impurities are introduced by implanting said second impurities approximately perpendicularly incident to said semiconductor substrate.

34. The method as set forth in claim 29, wherein said second impurities are introduced by implanting said second impurities obliquely incident to said semiconductor substrate while said semiconductor substrate is rotating.

35. A method for manufacturing a CMOS device, comprising the steps of:

forming a P-well for forming an N-channel MOS transistor and an N-well for forming a P-channel MOS transistor on a semiconductor substrate;

forming a shallow trench isolation layer made of silicon oxide between said P-well and said N-well;

introducing first impurities into said P-well to adjust a threshold voltage of said N-channel MOS transistor after said shallow trench isolation layer is formed;

introducing second impurities into said N-well to adjust a threshold voltage of said P-channel MOS transistor after said shallow trench isolation layer is formed;

introducing third impurities into edge portions of said P-well and into edge portions of said N-well after said first and second impurities are introduced, said edge portions being adjacent to said shallow trench isolation layer; and performing a heating process upon said semiconductor substrate so that a concentration of said first impurities in said MOS transistor area of said semiconductor substrate is substantially uniform, after said third impurities are introduced.

36. The method as set forth in claim 35, wherein said first impurities are boron atoms, said second impurities are arsenic atoms and said third impurities are boron atoms.

37. The method as set forth in claim 35, wherein said first impurities are boron atoms, said second impurities are phosphorus atoms and said third impurities are boron atoms.

38. The method as set forth in claim 35, wherein said third impurities are introduced before said shallow trench isolation layer is formed.

39. The method as set forth in claim 35, wherein said third impurities are introduced after said shallow trench layer is formed and before said first impurities are introduced.

40. The method as set forth in claim 35, further comprising the steps of:

forming first and second gate insulating layers on said P-well and said N-well, respectively, after said first and second impurities are introduced;

forming first and second gate electrodes on said first and second gate insulating layers, respectively;

introducing fourth impurities into said P-well by using said first gate electrode as a mask;

introducing fifth impurities into said N-well by using said second gate electrode as a mask; and said third impurities for the end portions of said P-well being introduced simultaneously with said fourth impurities for said N-well.

41. A method for manufacturing a CMOS device, comprising the steps of:

forming a P-well for forming an N-channel MOS transistor and an N-well for forming a P-channel MOS transistor on a semiconductor substrate;

forming a shallow trench isolation layer made of silicon oxide between said P-well and said N-well;

introducing first impurities into said P-well to adjust a threshold voltage of said N-channel MOS transistor after said shallow trench isolation layer is formed;

introducing second impurities into said N-well to adjust a threshold voltage of said P-channel MOS transistor after said shallow trench isolation layer is formed;

forming first and second gate insulating layers on said P-well and said N-well, respectively, after said first and second impurities are introduced;

forming first and second gate electrodes on said first and second gate insulating layers, respectively;

introducing third impurities into edge portions of said P-well and said N-well disposed adjacent to shallow trench isolation layer made of silicon oxide between said P-well and said N-well after said gate electrodes are formed;

introducing fourth impurities into said P-well after said gate electrodes are formed; and performing a heating process upon said semiconductor substrate so that a concentration of said impurities in said MOS transistor area of said semiconductor substrate is substantially uniform, after said fourth impurities are introduced.

42. A method for manufacturing a CMOS device, comprising the steps of:

forming an element partitioning layer made of silicon oxide in a semiconductor substrate;

introducing first impurities into a MOS transistor forming area for a MOS transistor of said semiconductor substrate surrounded by said element partitioning layer to adjust a threshold voltage of said MOS transistor;

implanting second impurities into an edge portion of said MOS transistor forming area of said semiconductor substrate; and performing a heating process upon said semiconductor substrate so that a concentration of said first impurities is substantially uniform in said MOS transistor forming area of said semiconductor substrate, after said first and second impurities are introduced.

* * * * *